(12) United States Patent
Miyakawa et al.

(10) Patent No.: US 8,449,143 B2
(45) Date of Patent: May 28, 2013

(54) METAL BASE CIRCUIT BOARD

(75) Inventors: Takeshi Miyakawa, Gunma (JP); Kenji Miyata, Gunma (JP); Taiki Nishi, Gunma (JP); Yoshihiko Okajima, Tokyo (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 424 days.

(21) Appl. No.: 12/600,377

(22) PCT Filed: May 14, 2008

(86) PCT No.: PCT/JP2008/058812
§ 371 (c)(1),
(2), (4) Date: Dec. 31, 2009

(87) PCT Pub. No.: WO2008/143076
PCT Pub. Date: Nov. 27, 2008

(65) Prior Publication Data
US 2010/0164362 A1 Jul. 1, 2010

(30) Foreign Application Priority Data

May 18, 2007 (JP) ................................ 2007-133113
Jul. 19, 2007 (JP) ................................ 2007-188145
Nov. 27, 2007 (JP) ................................ 2007-305389

(51) Int. Cl.
*F21V 7/00* (2006.01)

(52) U.S. Cl.
USPC ................. 362/247; 362/249.02; 362/296.01; 362/301

(58) Field of Classification Search
USPC ................. 362/247, 296, 296.01, 249.02, 301
See application file for complete search history.

(56) References Cited

U.S. PATENT DOCUMENTS

| 5,857,767 | A  | * | 1/1999  | Hochstein ..................... 362/294 |
| 7,201,497 | B2 | * | 4/2007  | Weaver et al. ........... 362/296.03 |
| 7,431,479 | B2 | * | 10/2008 | Weaver et al. ........... 362/296.07 |
| 7,717,591 | B2 | * | 5/2010  | Weaver et al. ................ 362/341 |
| 8,071,882 | B2 | * | 12/2011 | Okajima et al. .............. 174/250 |

FOREIGN PATENT DOCUMENTS

| JP | 2006 210490 | 8/2006 |
| JP | 2006-310014 | 11/2006 |
| WO | 2006 019730 | 2/2006 |

* cited by examiner

*Primary Examiner* — Cathy Lam
(74) *Attorney, Agent, or Firm* — Oblon, Spivak, McClelland, Maier & Neustadt, L.L.P.

(57) ABSTRACT

Provided is a metal base circuit board having a new function of a light reflection in addition to the conventional printed circuit board function for mounting electronic parts. The metal base circuit board has a circuit arranged on a metal plate via an insulation layer. A white film is arranged at least one the insulation layer.

23 Claims, 7 Drawing Sheets

METAL BASE CIRCUIT BOARD

TECHNICAL FIELD

The present invention relates to metal base circuit boards.

BACKGROUND ART

Conventionally, liquid crystal display devices have been used in various fields, and are used especially often in the electronics industry such as in personal computers and televisions. Liquid crystal display devices that employ a direct-type backlight system have backlights arranged on the rear surface of the liquid crystal panel, while those that employ an edge-type configuration direct light emitted from a light source into a light guide panel and emit the transported light from the front surface of the light guide panel through a prism sheet or the like, thereby illuminating the entire rear surface of the liquid crystal panel.

The light sources of backlights often consist of small fluorescent tubes known as CCFL's (Cold Cathode Fluorescent Lamp) or LED's (Light Emitting Diode). However, in recent years, concern for the environment has led to wider usage of backlights having LED light sources instead of CCFL's, which contain mercury.

Additionally, there is a demand to make liquid crystal display devices for televisions larger, and this requires large quantities of light. Therefore, there is a need to supply as much light as possible to the liquid crystal portions. In order to thus maximize the amount of light supplied from backlights, it is necessary to make effective use not only of the light emitted from LED's, but also of reflected light. The use of light reflecting sheets is common as a means for making effective use of such reflected light (see Patent Document 1). Conventionally, the printed circuit boards for mounting the LED packages used in direct backlights have not had a function of reflecting light, and so light reflecting sheets were applied to the printed circuit boards after mounting LED packages in order to use them in backlights.

DISCLOSURE OF THE INVENTION

Problems to be Solved by the Invention

However, Patent Document 1 has a problem in that the increase in the number of steps in the production process and necessary parts makes the production process bothersome and inconvenient.

On the other hand, a method of obtaining more highly reflective light by plating the circuit portions with silver, which is a highly reflective metal, has also been conventionally used. However, the techniques for plating with silver which is a highly reflective metal carry a substantial risk of causing ion migration when used (DC voltage applied) in high humidity/high temperature environments, thus reducing the reliability of the insulation.
Patent Document 1: JP 2006-310014A In other words, the purpose of the present invention is to offer a metal base circuit board having the new function of reflecting light in addition to the function of conventional printed circuit boards which is to mount electronic parts.

Means for Solving the Problems

The present invention offers a metal base circuit board comprising a circuit provided on a metal plate with an insulating layer in between, wherein a white film is provided on at least the insulating layer.

Additionally, the present invention offers a metal base circuit board having a plurality of insulating layers and circuits alternately provided on a metal plate, wherein a white film is provided on at least the insulating layer furthest from the metal plate.

Additionally, the present invention offers a metal base circuit board layered with a metal plate, an insulating layer formed on one or both surfaces of said metal plate, a circuit formed by metallic foil on said insulating layer, and a metal of a different type from the metal forming said circuit, wherein said circuit is composed of copper foil, and a nickel layer or aluminum layer is layered over part or all of said copper foil.

The metal base circuit board consisting of the above structure enables effective use of reflected light using only a metal base circuit board without the need to apply light reflecting sheets after mounting LED's. In other words, a metal base circuit board having a new function of reflecting light in addition to the function of conventional printed circuit boards which is to mount electronic parts is obtained.

EFFECTS OF THE INVENTION

The present invention offers a circuit board having a new function of reflecting light in addition to the function of conventional printed circuit boards which is to mount electronic parts.

| Description of the Reference Numbers | |
|---|---|
| 11 | metal plate (metal foil) |
| 12 | insulating layer |
| 13 | circuit |
| 14 | white film |
| 15 | LED package |
| 16 | solder joint portion |
| 21 | metal plate |
| 22 | insulating layer |
| 23 | circuit |
| 24 | white film |
| 25 | solder joint portion |
| 26 | LED package |
| 31 | metal plate |
| 32 | insulating layer (first layer) |

-continued

Description of the Reference Numbers

| | |
|---|---|
| 33 | insulating layer (second layer) |
| 34 | circuit (first layer) |
| 35 | metal column (filled via) |
| 36 | circuit (second layer) |
| 37 | white film |
| 38 | solder joint portion |
| 39 | LED package |
| 41 | metal plate (substrate) |
| 42 | insulating layer |
| 43 | circuit foil (A) (copper) |
| 44 | circuit foil (B) (aluminum or nickel) |
| 45 | white film (solder resist) |
| 46 | metal base circuit board |
| 47 | solder joint portion |
| 48 | LED electrode terminal |
| 49 | LED |
| 51 | metal plate (substrate) |
| 52 | insulating layer |
| 53 | circuit foil (A) (aluminum) |
| 54 | circuit foil (B) (copper or nickel) |
| 55 | white film (solder resist) |
| 56 | metal base circuit board |
| 57 | solder joint portion |
| 58 | LED electrode terminal |
| 59 | LED |
| 61 | metal plate (substrate) |
| 62 | insulating layer |
| 63 | circuit foil (A) (aluminum) |
| 64 | circuit foil (B) (copper or nickel) |
| 65 | metal base circuit board |
| 66 | solder joint portion |
| 67 | LED electrode terminal |
| 68 | LED |
| 71 | metal plate (substrate) |
| 72 | insulating layer |
| 73 | circuit foil (A) (copper) |
| 74 | circuit foil (B) (aluminum or nickel) |
| 75 | metal base circuit board |
| 76 | solder joint portion |
| 77 | LED electrode terminal |
| 78 | LED |

BEST MODES FOR CARRYING OUT THE INVENTION

<Explanation of Terminology>
[Reflectivity]

The term "reflectivity" as used in the present specification is the light incident on the substrate surface minus the light absorbed in the substrate layer and the transmitted light. The reflectance is measured by a measuring device capable of making measurements in at least the 400-800 nm wavelength range, with a spectrophotometer equipped with an integrating sphere. The present inventors used a Shimadzu UV-2550, with an ISR2200 integrating sphere. This measuring device is capable of making measurements in the wavelength range from 220 nm to 850 nm.

Herebelow, the embodiments of the present invention shall be explained with reference to FIGS. 1-7.

<Embodiment 1>

Figure 1:
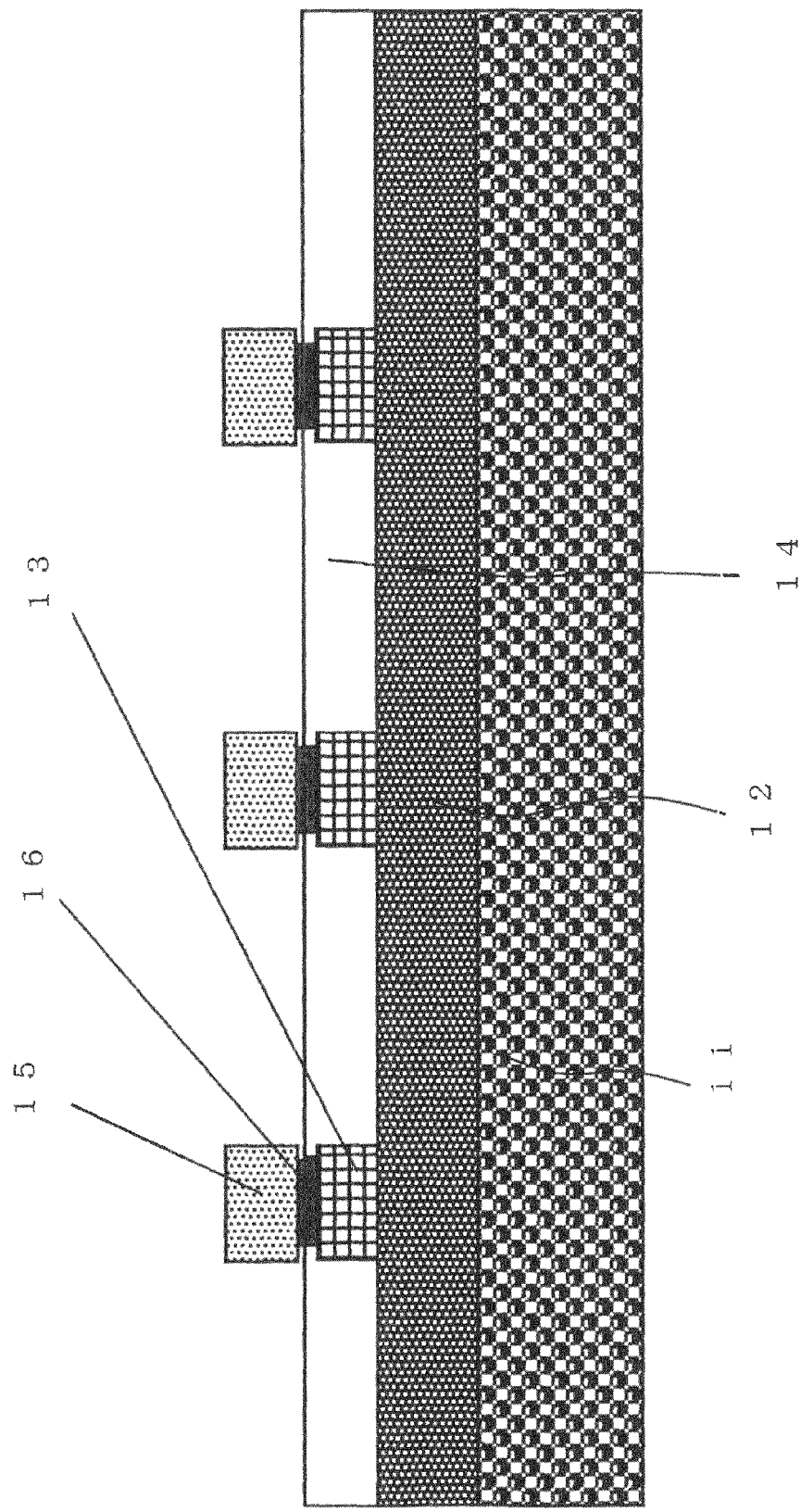
[FIG. 1] A diagram showing an example of a metal base circuit board according to Embodiment 1 of the present invention.

FIG. 1 is a schematic view showing an example of a metal base circuit board according to Embodiment 1. The metal base circuit board according to Embodiment 1 comprises a metal plate (metal foil) 11, an insulating layer 12 and a circuit 13, the metal base circuit board having a highly reflective white film 14 formed thereon, and onto which a plurality of LED packages 15 are mounted by means of solder joint portions 16.

Embodiment 1 is characterized by the white film having a high reflectivity, the reflectivity being preferably at least 80% for the visible light range of 420-800 nm. Further, the reflectivity for light of wavelengths 460 nm (blue), 525 nm (green), and 620 nm (red) should preferably be at least 80% for each.

The metal base circuit board according to Embodiment 1 has the structure given above, and further the insulating layer 12 has high thermal dissipation and withstand voltage characteristics, the thermal conductivity thereof being 1-4 W/mK, and the withstand voltage between the conducting circuit 13 and the metal foil 11 being 1.5 kV or greater, preferably 2 kV or greater.

Further, a decrease in the luminous efficiency of the LED can be suppressed by making the rise in temperature of the LED small, by decreasing the accumulation of heat in the circuit board whereupon the LED light source is mounted, by dissipating heat generated from the LED light source (LED package 15) efficiently to the rear face side of the metal base circuit board, and further, dissipating heat to the exterior. Consequently, in conjunction with the effect of the highly reflective white film 14, having a light reflecting function, a bright backlight having a long operating lifetime can be provided.

Herebelow, each constituent element of the metal base circuit board according to Embodiment 1 shall be explained in detail.

[Metal Plate (Metal Foil)]

In Embodiment 1, for the metal plate (metal foil) 11, it is preferable to use copper and copper alloy, aluminum and aluminum alloy, iron as well as stainless steel, having a good thermal conductivity.

Additionally, it is preferable for the thickness of the metal plate (metal foil) 11 to be 9 µM or greater, and 400 µm or less. If the thickness of the metal plate (metal foil) 11 is 9 µm or greater, then there is no worry that the metal base circuit board will become unsuited for actual use due to a decrease in the rigidity of the metal base circuit board, and if the thickness is 400 µm or less, this is useful for miniaturization.

[Insulating Layer]

In Embodiment 1, it is preferable for the thickness of the insulating layer 12 to be 80 µm or greater and 200 µm or less. If the thickness is 80 µm or greater, electrical insulation can be secured, and if the thickness is 200 µm or less, adequate heat dissipation can be achieved, and this also contributes to miniaturization.

For the insulating layer 12, thermosetting resin is normally used, and for the thermosetting resin, epoxy resin, phenol resin, silicone resin, acrylic resin, and the like may be used. Among these, it is preferable to use those that have as the principle components bifunctional epoxy resin and polyaddition type curing agents, which, while containing inorganic fillers, have an excellent bonding strength with the metal plate (metal foil) 11 and the circuit 13 and insulating property, in the cured state.

As the polyaddition type curing agents, it is preferable to use anhydrides or phenols that have excellent mechanical and electrical properties, and in order to secure the mechanical and electrical properties of the insulating layer, it is preferable to add these so that the active hydrogen equivalent weight is 0.8 to 1 times the epoxy equivalent weight of the epoxy resin contained in the thermosetting resin.

As said epoxy resin, it is preferable to use a relatively cheaply acquirable bifunctional epoxy resin, such as bisphenol A diglycidyl ether, bisphenol F diglycidyl ether, bisphenol S diglycidyl ether, resorcinol diglycidyl ether, hexahydrobisphenol A diglycidyl ether, polypropylene glycol diglycidyl ether, neopentyl glycol diglycidyl ether, phthalic acid diglycidyl ester, or dimer acid diglycidyl ester.

As the polyaddition type curing agent, it is preferable to use a relatively cheaply acquirable anhydride, such as phthalic anhydride, tetrahydro methyl phthalic anhydride, hexahydro phthalic anhydride, trimellitic anhydride, methyl nadic anhydride, or a phenol, such as phenol novolac.

Additionally, in order to improve the curing reaction of said epoxy resin and polyaddition type curing agent, a curing catalyst may be added. As a curing catalyst, imidazole-based catalysts are preferable, such as 2-methyl imidazole, 2-undecyl imidazole, 2-heptadecyl imidazole, 1,2-dimethyl imidazole, 2-methyl-4-methyl imidazole, 2-phenyl imidazole, 2-phenyl-4-methyl imidazole, 2-phenyl imidazole, 2-phenyl-4-methyl imidazole, 1-benzyl-2-methyl imidazole, 1-benzyl-2-phenyl imidazole, 2,3-dihydro-1H-pyrolo[1,2-a]benzimidazole, 2-phenyl-4,5-dihydroxymethyl imidazole, 2,4-diamino-6-[2'-methyl imidazolyl-(1')]-ethyl-s-triazine, 2,4-diamino-6-[2'-undecyl imidazolyl-(1')]-ethyl-s-triazine, 1-cyanomethyl-2-methyl imidazole.

It is preferable for the chloride ion concentration in the thermosetting resin constituting the insulating layer 12 to be 1000 ppm or less, and more preferable for it to be 500 ppm or less. If the chloride ion concentration in the thermosetting resin composition is 1000 ppm or less, the movement of ionic impurities under high temperatures or direct voltages and the consequent reduction of the electrical insulation property can be suppressed.

[Inorganic Filler]

For the inorganic filler contained in the insulating layer 12, it is preferable to use one that is electrically insulating and has good thermal conductivity; for example, silica, alumina, aluminum nitride, silicon nitride, boron nitride, or the like may be used.

It is preferable for the amount of inorganic filler contained in the insulating layer 12 to be 50% by volume or greater and 75% by volume or less, in order to maintain an appropriate fluidity. Additionally, it is preferable for the inorganic filler to contain two types of grain sizes, with average grain sizes of 0.6 to 2.4 µm and 5 to 20 µm. By mixing together coarse particles having a large average grain size and fine particles having a small average grain size, greater packing than when each type is used alone becomes possible, and good thermal conductivity can thereby be obtained. Additionally, the grain shapes may be crushed, spherical, or scale-like.

If said amount of inorganic filler contained is 50% by volume or greater, the thermal conductivity necessary for a circuit board for a backlight that uses an LED package can be obtained, and if it is 75% by volume or less, then the insulating material will not become highly viscous and make the coating of the insulating material difficult, so that problems with the mechanical properties or electrical properties will not arise.

Additionally, it is preferable for the sodium ion concentration of the inorganic filler to be 500 ppm or less, and more preferable for it to be 100 ppm or less. If the sodium ion concentration in the inorganic filler is 500 ppm or less, then the movement of ionic impurities under high temperatures or direct voltages and the consequent reduction of the electrical insulation property can be suppressed.

[Circuit]

It is preferable for the thickness of the circuit 13 to be 9 µm or greater and 140 µm or less. If the thickness of the circuit 13 is 9 µm or greater, a function as a circuit can be sufficiently achieved, and if it is 140 µM or less, it will not make miniaturization or more difficult by making the thickness too great. Additionally, for the circuit 13, it is preferable to use copper, aluminum, nickel, and alloys containing these.

[White Film]

For the white film 14, it is preferable for it to have a reflectivity of 80% or greater in the visible light region of 420 to 800 nm. Further, for light having the wavelengths of 460 nm (blue), 525 nm (green), and 620 nm (red), it is preferable to have a reflectivity of 80% or greater for each.

For such a material, it is preferable to use a white solder resist. As a white solder resist, a thermally curable white solder resist, a UV curable white solder resist, a combination UV-thermally curable white solder resist, and the like may be used.

As a white pigment contained in said white solder resist, titanium dioxide is preferable, and among this rutile type is more preferable. Since the rutile type has excellent stability, its photocatalytic action is weak, so in comparison to other forms, the deterioration of the resin components can be suppressed.

Regarding said titanium dioxide, it is more preferable for this to be coated with silicon dioxide or aluminum hydroxide or the like. Titanium dioxide that has been treated in this manner will have its photocatalytic activity further suppressed, and so the deterioration of the resin component can be suppressed. Additionally, with regard to the titanium dioxide content, from the standpoint of the durability of the white film itself, it is preferable for this to be 30 wt % or greater and 60 wt % or less of the white film.

For the resin to be used in said solder resist, from the standpoint of the durability of the white film itself, an epoxy resin for the case of a thermally curable type white solder resist, an acryl resin for the case of a UV curable type white solder resist, and the combined use of an epoxy resin and an acryl resin for the case of a combination UV-thermally curable white solder resist is preferable.

<Embodiment 2>

Figure 2:
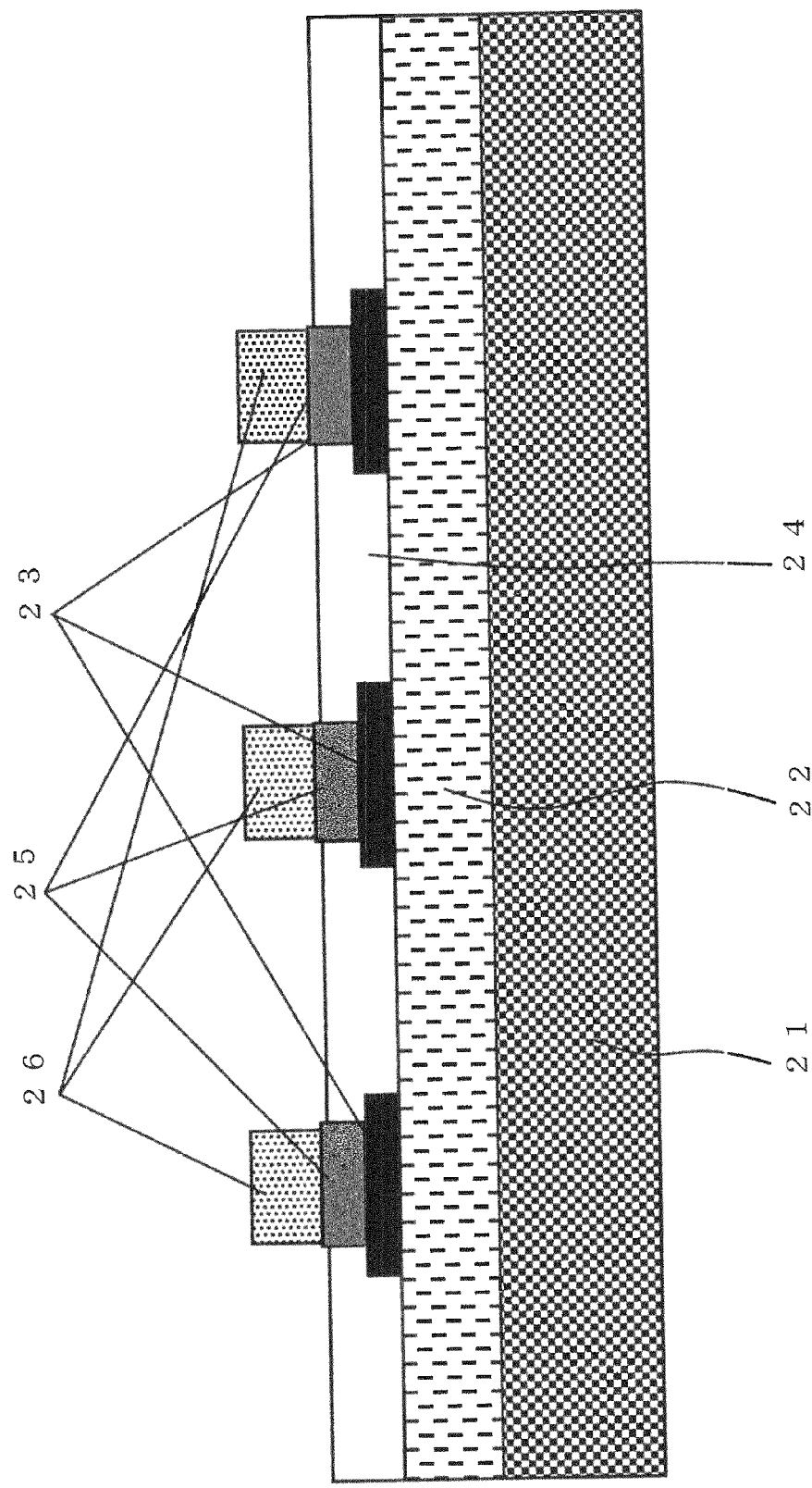
[FIG. 2] diagram showing an example of a single-layer metal base circuit board according to Embodiment 2 of the present invention.

FIG. 2 is a schematic view showing one example of the single layer circuit board of the single layer circuit metal base circuit board according to Embodiment 2. The metal base circuit board of FIG. 2 is such that, on a metal base circuit board including a metal plate 21, an insulating layer 22, and a circuit 23, a white film 24 having a high reflectivity is formed. As FIG. 2 shows by example, the white film 24 may be provided in such a manner that it covers not only the insulating layer 22, but also the entire surface of the circuit 23 or a portion thereof. Additionally, the single layer circuit metal base circuit board according to Embodiment 2 is used by mounting and joining one or more LED packages 26 with solder joint portions 25 or the like.

Figure 3:
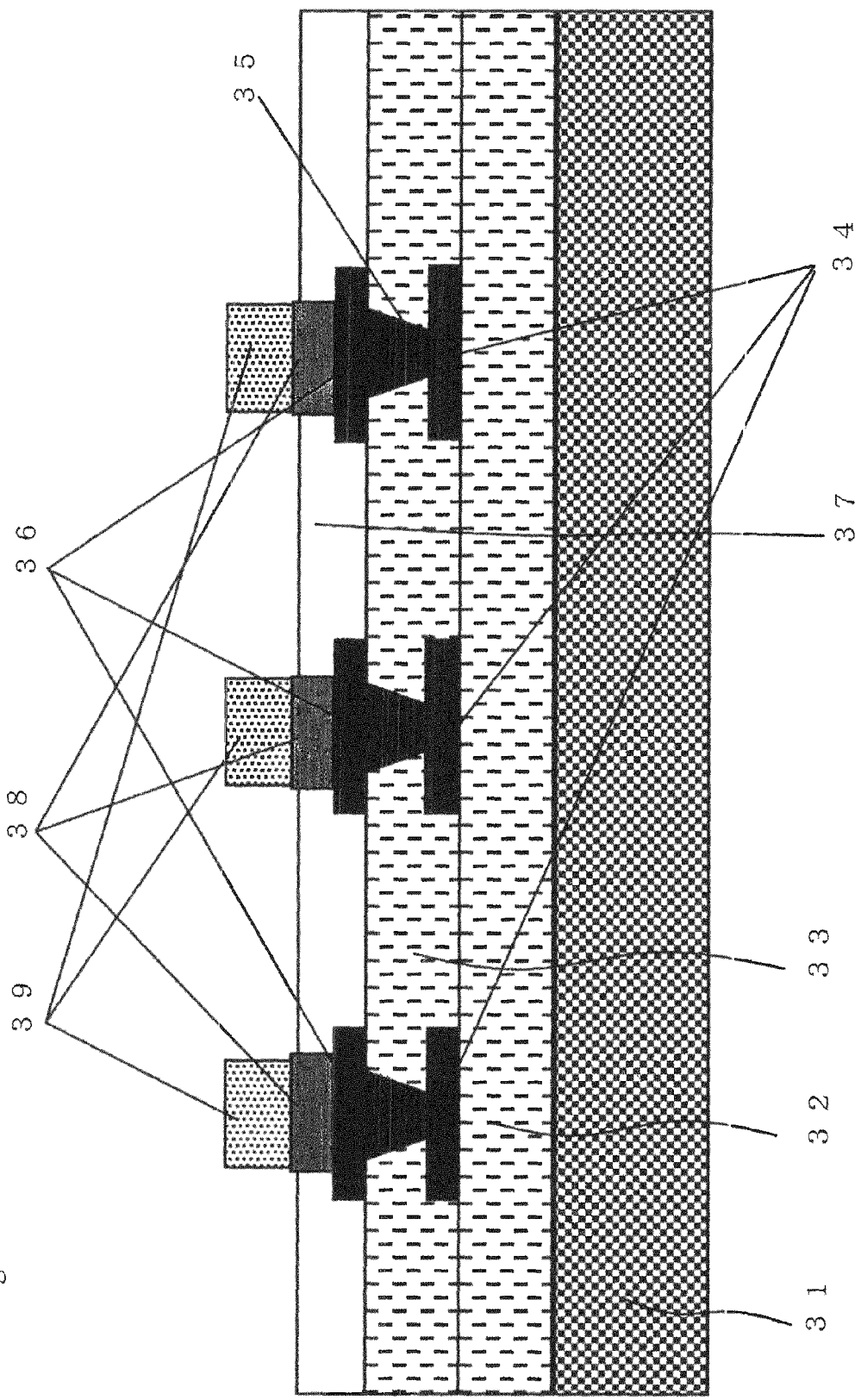
[FIG. 3] A diagram showing an example of a multi-layer metal base circuit board according to Embodiment 2 of the present invention.

Additionally, the metal base circuit board according to Embodiment 2 may be a multi-layer circuit board as shown in FIG. 3. FIG. 3 is a schematic view that shows one example of the multi-layer circuit metal base circuit board according to Embodiment 2. The multi-layer circuit metal base circuit board according to Embodiment 2 is a metal base circuit board where a plurality of insulating layers 32, 33, and circuits 34, 36 are alternatively formed upon a metal plate 31, and is such that a white film 37 having a high reflectivity is formed on the insulating layer 33 that is furthest from the metal plate 31. As FIG. 3 shows by example, the white film 37 may be provided in such a manner that it covers not only the insulating layer 33, but also the entire surface of the circuit 36 or a portion thereof. The multi-layer circuit metal base circuit board according to Embodiment 2 is such that one or more LED packages 39 are mounted and joined with solder joint portions 38 or the like. Further, FIG. 3 shows the example of a metal base circuit board having a two layer structure, but the basic structure is similar for a structure having three layers or more.

The metal base circuit board according to Embodiment 2 has a high reflectivity due to a white film being provided on at least the insulating layer of the metal base circuit board. And when used for LED mounted applications, it does not deteriorate due to the light emitted by the LED, and further, when using the LED as a backlight for a liquid crystal display device, it contributes to the light of the backlight being used efficiently, so that it has the characteristic of being suitable for this purpose.

Herebelow, each component of the single layer circuit metal base circuit board according to Embodiment 2 shall be explained in detail. Further, regarding each component of the multi-layer circuit metal base circuit board according to Embodiment 2, they are similar to those for the single layer circuit metal base circuit board according to Embodiment 2.

[Metal Plate]

The metal plate 21 may be aluminum, iron, copper, or alloys thereof, but in consideration of thermal dissipation, aluminum, copper, or alloys thereof are preferable. Additionally, if necessary, in order to improve the adhesion to the insulating layer, surface treatments such as sandblasting, etching, various plating processes, and coupling treatment may be carried out on the side of the surface to be bonded to the insulating layer. Further, it is possible to circuitize the metal plate 31 by utilizing the publicly known arts described above.

It is preferable for the thickness of the metal plate 21 to be 0.013 mm or greater, preferably 0.05 mm or greater. If the thickness is greater than 0.013 mm, then wrinkling will not occur during handling. Regarding an upper limit, there are no technical restrictions, but when the thickness is 0.5 mm or less, it is suitable as a circuit board with a mounted LED used as a backlight for a liquid crystal display device, but if the thickness of the metal circuit board becomes greater than 4 mm, then its use as a metal base circuit board cannot be attained, so it is not practical.

[Insulating Layer]

In the metal base circuit board according to Embodiment 2, the thermal conductivity of the insulating layer 22 is 1 W/mK or greater, preferably 1.5 W/mK. When an LED is mounted on a metal base circuit board using an insulating layer having a thermal conductivity of 1 W/mK or greater, the heat that is generated from the LED light source is efficiently thermally dissipated to the rear side of the metal base circuit board, and further, because the heat is dissipated externally, heat accumulation in the LED package mounted circuit board can be reduced, and the temperature increase of the LED can be kept small, while at the same time, by making the temperature inside the backlight surface uniform, the reduction of the light emitting efficiency of the LED can be suppressed, and uniformity of the brightness can be achieved. Whereby, in combination with the effects of a white film having a high reflectivity having a light reflecting function, a bright and long-lasting back light can be provided.

Additionally, it is preferable to have a withstand voltage characteristic such that the withstand voltage between the circuit 23 and the metal plate 21 is 1.5 kV or greater, preferably 2 kV or greater. If the withstand voltage is 1.5 kV or greater, when an LED is mounted, the LED can be operated stably.

As the material comprising the insulating layer 22, a resin used for circuit boards, such as phenol resin, imide resin, silicone resin, epox resin may be selected, but from the standpoint of obtaining the thermal conductivity and withstand voltage characteristics mentioned above, it is preferable to use one that contains an inorganic filler, an epoxy resin, and a curing agent for the epoxy resin.

For the thickness of the insulating layer 22, it is preferable for it to be 50 µm or greater, and 400 µm or less, and further preferable that it be 80 µm or greater, and 200 µm or less. If the thickness is 50 µm or greater, electrical insulation can be secured, and if the thickness is 400 µm or less, adequate heat dissipation can be achieved, and this contributes to miniaturization.

For said epoxy resin, a relatively cheaply obtainable publicly known epoxy resin, such as naphthalene type, phenylmethane type, tetrakisphenol type, biphenyl type, and bisphenol A alkylene oxide added type epoxy resins may be used. Of these, for the reason of stress relaxation, an epoxy resin with a main chain having a polyether framework and that is a straight chain is preferable.

Here, as an epoxy resin with a main chain having a polyether framework and that is a straight chain, relatively cheaply obtainable aliphatic epoxy resins such as bisphenol A type and bisphenol F type epoxy resins, bisphenol A type hydrogenated epoxy resin, polypropylene glycol type epoxy resin, polytetramethylene glycol type epoxy resin, and polysulphide modified epoxy resin and the like may be used, or a plurality of these may be used in combination.

Additionally, in cases where a high heat resistance is needed for the metal base circuit board, by using bisphenol A type epoxy resin alone or in combination with other epoxy resins, a cured resin body with a high electrical insulating property, high thermal conductivity, and a high heat resistance can be obtained.

Regarding said bisphenol A type epoxy resin, it is more preferable that its epoxy equivalent weight to be 300 or less. This is because if the epoxy equivalent weight is 300 or less, a decrease in Tg due to a decrease in crosslink density when it becomes a polymer type, and the consequent lowering of heat resistance, can be prevented. Additionally, the following problem can be avoided. If the molecular weight becomes large, it goes from liquid to solid, so it becomes difficult to blend an inorganic filler with the curable resin, so a uniform resin composition cannot be obtained.

It is preferable for said epoxy resin to have a hydrolyzable chlorine concentration of 600 ppm or less. If the hydrolyzable chlorine concentration is 600 ppm or less, a moisture resistance that is sufficient for a metal base circuit board can be attained.

It is preferable to add a curing agent to said epoxy resin. As a curing agent, it is preferable to use one or more types from the group comprising aromatic amine based resins, anhydride based resins, phenol based resins, and dicyandiamide.

Regarding the amount of said curing agent to be added, in order to obtain a sufficient strength after curing, it is preferable for the amount to be 5 mass portions or greater and 50 mass portions or less, and more preferable for the amount to be 10 mass portions or greater and 35 mass portions or less, relative to 100 mass portions of epoxy resin.

Additionally, for said epoxy resin, a curing catalyst can be used as needed. As a curing catalyst, imidazole compounds, organic phosphate compounds, tertiary amines, and quaternary ammonium and the like are generally used, and one or more types of these can be selected. Additionally, regarding the amount to be added, this will vary according to the curing temperature, so there is no special restriction, but generally it is preferable for the amount to be 0.01 mass portions or greater and 5 mass portions or less, relative to 100 mass portions of epoxy resin. If 0.01 mass portions or greater, the amount of curing will be sufficient, and if 5 weight portions or less, then the control of the degree of curing during the manufacturing process of the circuit board will become easy.

[Inorganic Filler]

For the inorganic filler contained in the insulating layer 22, any type may be used as long as it is electrically insulating and has excellent thermal conductivity. For such a substance, silicon oxide, aluminum oxide, aluminum nitride, boron nitride, magnesium oxide, silicon nitride, and the like are preferably used, because a stable electrical insulating property can be obtained. These fillers can be used alone, but a plurality of them may also be used in combination.

For said inorganic filler, aluminum nitride and boron nitride are especially preferable because they have a high thermal conductivity. Additionally, by using silicon dioxide and boron nitride, it becomes possible to keep the dielectric constant of the cured body low, so these are preferable when used as a thermal dissipation material for electrical or electronic parts that are used for high frequency waves, since an electrical insulating property can easily be attained.

Further, in order to improve handling and fluidity, it is preferable for the aspect ratio of the grain shape of said inorganic filler to be close to 1. Mixing together coarse and fine grains is further preferable, since a higher packing is possible than when using only crushed grains or spherical grains.

As said inorganic filler, it is possible to mix and use a plurality of grain groups (powders) of coarse grains and fine grains, with the aim of improving the thermal conductivity of the insulating layer. For example, when coarse grains and fine grains are mixed together and used, it is preferable to use a coarse grained powder with an average grain size of 5 μm or greater and a fine grained powder of 5 μm or less. It is preferable for the ratio of the coarse grained powder and the fine grained powder to be such that the coarse grained powder is 40% or greater by volume and 98% or less by volume of the entirety of the inorganic filler, and more preferably to be 50% or greater by volume and 96% or less by volume.

In order to secure an appropriate fluidity, it is preferable for the composition ratio of said inorganic filler to be 70 mass portions or greater and 95 mass portions or less relative to a total amount of 100 mass portions for the epoxy resin and the curing agent for the epoxy resin, and more preferable for this to be 80 mass portions or greater and 90 mass portions or less.

[White Pigment to be Added to the Insulating Layer]

It is preferable to add at least one type or more of white pigment, selected from among zinc oxide, calcium carbonate, titanium dioxide, alumina, and smectite. Whereby, the effect of further improving the reflectivity of the metal base circuit board can be achieved.

In particular, for a multi-layer circuit as shown in FIG. 3, by including a white pigment in the insulating layer comprising the outermost layer (insulating layer (second layer) 33 in FIG. 3), which is furthest from the metal plate, the effect of further improving the reflectivity of the metal base circuit board can be achieved.

When adding a white pigment to the insulating layer 22, it is preferable for the amount to be added to be 5 to 50% by volume relative to the entire insulating layer, and it is more preferable for the amount to be 5 to 30% by volume. At 5% by volume or greater a sufficient effect of improving reflectivity can be obtained, and at 50% by volume or less, there is no worry that dispersal cannot be carried out during the operation to form the insulating layer.

Among said white pigments, titanium dioxide (titania) has the highest refractive index, and it is preferably used for increasing the light reflectivity of the circuit board. Two types of crystal systems of titanium dioxide are known, anatase type and rutile type, but rutile type is preferable because it has a weaker photocatalytic effect due to excellent stability. Additionally, with regard to titanium dioxide, it is preferable that the average grain size be 0.30 μm or less in order to increase the scattering efficiency of light.

Among said white pigments, zinc oxide is a material that has both a high refractive index and a high heat dissipation property, so it is preferably used in cases where the reflectivity and heat dissipation property of the plate is to be made high. Additionally, in cases where the light scattering efficiency of zinc oxide is to be made high, it is preferable for the average grain size to be 0.35 μm or less.

Additionally, it is possible to add, as needed, various types of publicly known auxiliary agents, such as a dispersing aid such as a coupling agent, or a viscosity modifier such as a solvent, as long as it does not conflict with the aim of the present invention.

When modifying the insulating reliability and the light reflectivity of the insulating layer, it is effective to make the structure of the insulating layer a two layer structure as shown in FIG. 3. When making the insulating layer a two layer structure, it is preferable to have a functionally separated structure, where the first layer (insulating layer (first layer) 32 in FIG. 3), being the inner layer, is an insulating layer with a high insulating property, and the second layer (insulating layer (second layer) 33 in FIG. 2) is an insulating layer with a high reflectivity. Additionally, in order to obtain the desired characteristics, it is more effective to change the ratio of thicknesses of the respective insulating layers.

[Circuit]

The material comprising the circuit 23 may be aluminum, iron, copper, or alloys thereof, but in consideration of thermal dissipation, aluminum, copper or alloys thereof are preferable. Additionally, if necessary, in order to improve adhesion to the insulating layer, surface treatments such as sandblasting, etching, various plating processes, and coupling treatment may be carried out on the side of the surface to be bonded to the insulating layer.

It is preferable for the thickness of the circuit 23 to be 0.005 mm or greater and 0.400 mm or less, and more preferable for the thickness to be 0.03 mm or greater and 0.30 mm or less. If the thickness is 0.005 mm or greater, then a conducting circuit sufficient for a circuit board for a backlight can be secured, and if the thickness is 0.400 mm or less, then no problems will arise in the manufacturing process for forming the circuit.

[White Film]

It is preferable for the white film 24 to have a high reflectivity for light of various wavelengths, and in order to make it appropriate for use in a backlight for a liquid crystal display device, it is preferable for the reflectivity to light having a wavelength from 420 to 800 nm to be high.

It is preferable for the minimum value of the reflectivity of the white film 24 for light having a wavelength from 420 to 800 nm to be 70% or greater. Further, for each of the wavelength ranges from 450 to 470 nm, 520 to 570 nm, and 620 to 660 nm, it is preferable for the maximum reflectivity of the white film 24 to be 80% or greater, and more preferable for the reflectivity to be 85% or greater.

Concretely, the white film 24 can be obtained by mixing a white pigment into a resin composition containing a photo-curable resin or a thermosetting resin. As a photo-curable resin or a thermosetting resin, epoxy resin, acryl resin, and mixtures thereof may be used appropriately, but the invention is not restricted to these.

As the white pigment to be contained in the white film 24, it is preferable to use at least one type or more of white pigment selected from among zinc oxide, calcium carbonate, titanium dioxide, alumina, and smectite, and among these, titanium dioxide is preferable, because a high reflectivity is thereby obtainable.

For the titanium dioxide, the rutile type has excellent stability so its photocatalytic action is weak, and since the deterioration of the resin component will thereby be suppressed in comparison to other structures, it is suitable for use. Further, titanium dioxide that has had various surface treatments and thereby has its photocatalytic action suppressed is also suitable for use. As a representative example of a surface treatment, coating with silicon dioxide, aluminum hydroxide, and the like can be given.

It is preferable for the amount of white pigment contained in the white film 24 to be 30% by volume or greater and 70% by volume or less, and more preferably 30% by volume or greater and 60% by volume or less. If the amount is 30% by volume or greater, a sufficient reflecting effect can be obtained, and if the amount is 70% by volume or less, there is no worry that the fluidity during film formation will be decreased and a uniform film cannot thereby be formed.

Further, when forming a white film 24 on the circuit 23, apertures can be provided beforehand for portions that correspond to the mounting portion for the LED package 26 and the wiring portions.

<Embodiment 3>

Figure 4:
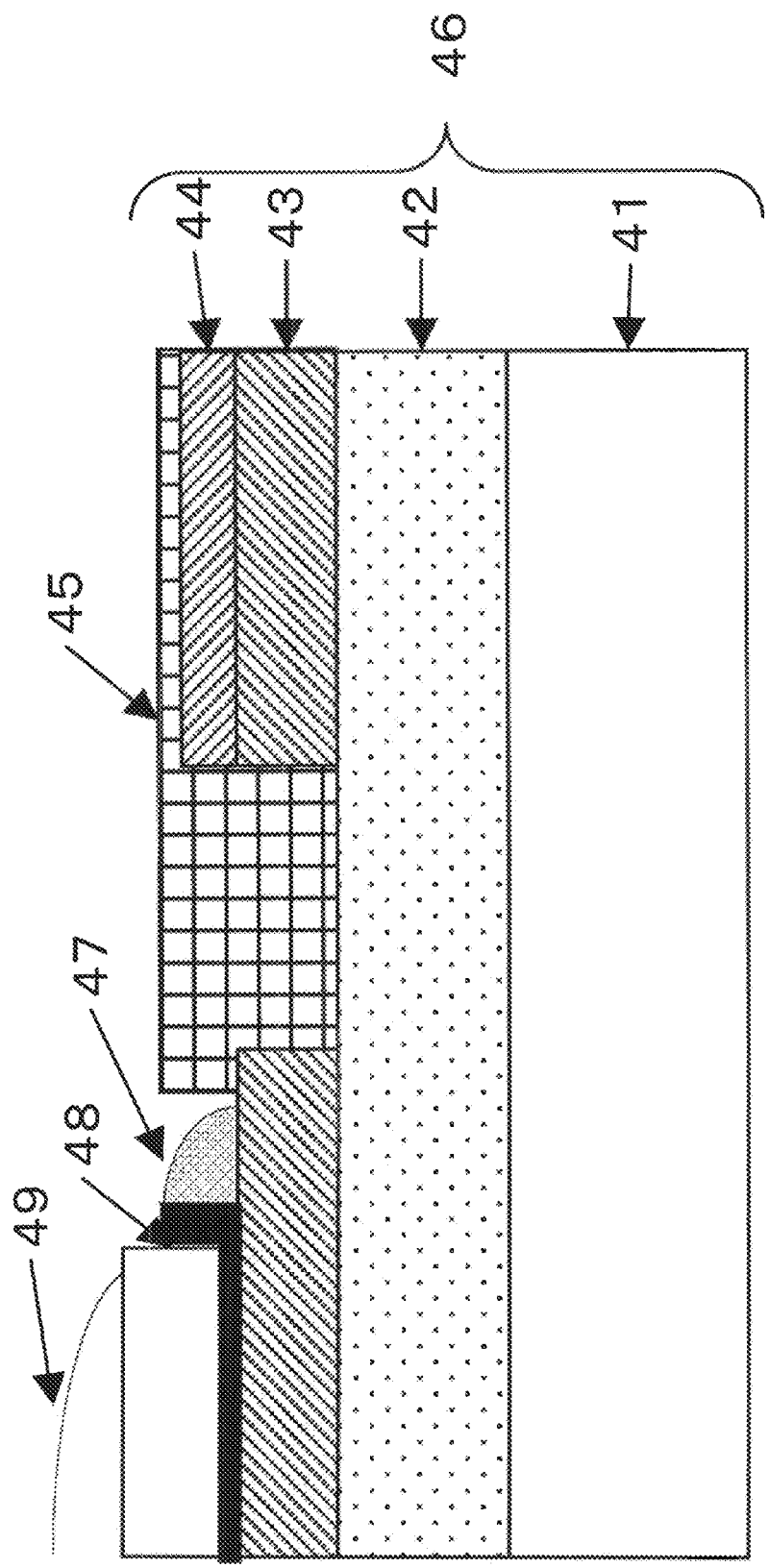
[FIG. 4] A diagram showing an example of a metal base circuit board according to Embodiment 3 of the present invention.

FIG. 4 is a schematic view showing one example of a metal base circuit board according to Embodiment 3. In the metal base circuit board of Embodiment 3, a white film 45 having a high reflectivity is formed on top of a metal base circuit board 46 comprising a metal plate (substrate) 41, an insulating layer 42, a circuit foil (A) 43 (copper), and a circuit foil (B) 44 (aluminum or nickel), and a plurality of LEDs 49 are mounted and joined by solder joint portions 47 and the like.

Embodiment 3 has the characteristic that the circuit foil (B) 44 (aluminum or nickel) and the white film 45 on said circuit foil have a high reflectivity, and it is preferable for this to be a high reflectivity of 80% or greater in the visible light region from 420 nm to 800 nm. Further, it is preferable to have a reflectivity of 80% or greater for light having a wavelength of 460 nm (blue), 525 nm (green), and 620 nm (red).

The metal base circuit board according to Embodiment 3 has said structure, and further the insulating layer has high thermal dissipation and withstand voltage characteristics, the thermal conductivity thereof being 1.0 W/mk to 16.0 W/mK, and the withstand voltage between the conducting circuit and the substrate (made of metal foil) being 1.5 kV or greater, preferably 2 kV or greater, and the reduction of the luminous efficiency of the LED can be suppressed by lessening the temperature rise of the LED, by decreasing the accumulation of heat in the LED package-mounted circuit board, by dissipating heat generated from the LED light source efficiently to the rear face side of the circuit board, and further, dissipating heat to the exterior. Consequently, by combining the effect of a circuit foil (B) 44 (aluminum or nickel) having a light reflecting function, and the effect of a white film 45 expected to have a synergistic effect with said circuit foil (B) 44, a bright backlight having a long operating lifetime can be provided.

<Embodiment 4>

Figure 5:
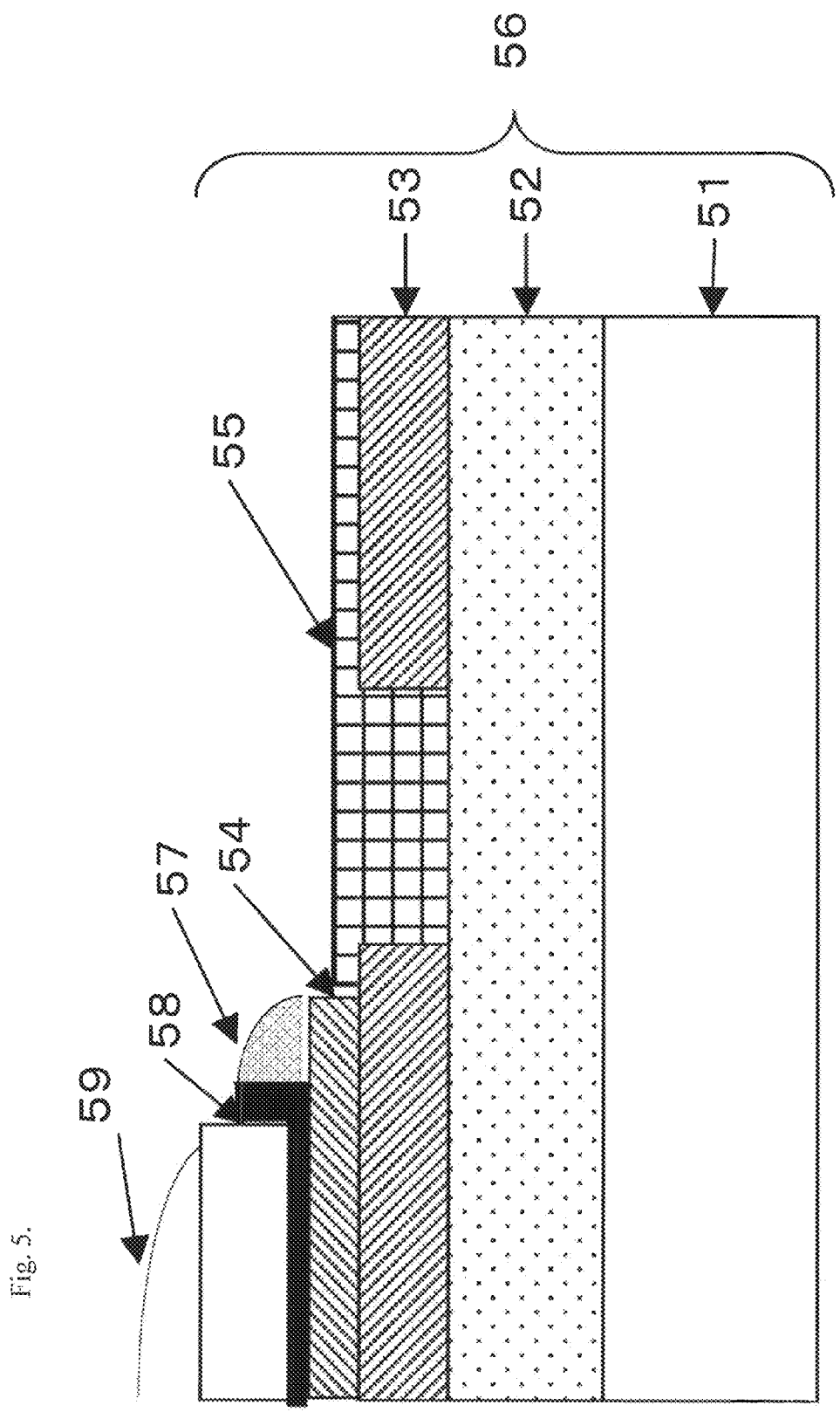
[FIG. 5] A diagram showing an example of a metal base circuit board according to Embodiment 4 of the present invention.

FIG. 5 is a schematic view showing one example of a metal base circuit board according to Embodiment 4. In the metal base circuit board of Embodiment 4, a white film 55 having a high reflectivity is formed on top of a metal base circuit board 56 comprising a metal plate (substrate) 51, an insulating layer 52, a circuit foil (A) 53 (aluminum), and a circuit foil (B) 54 (copper or nickel), and a plurality of LEDs 59 are mounted and joined by solder joint portions 57 and the like.

Embodiment 4 has the characteristic that the circuit foil (A) 53 (aluminum) and the white film 55 on said circuit foil have a high reflectivity, and it is preferable for this to be a reflectivity of 80% or greater in the visible light region from 420 nm to 800 nm. Further, it is preferable to have a reflectivity of 80% or greater for light having a wavelength of 460 nm (blue), 525 nm (green), and 620 nm (red).

It is preferable for the surface of said circuit foil (A) 53 (aluminum) to have a ten point average roughness (Rz) of 1.0 μm or less. It is preferable to make the value of the ten point average roughness (Rz) small, because the effects of conductor loss during high frequency response will be small, and a sufficient bonding strength with the insulating layer can be secured.

<Embodiment 5>

Figure 6:
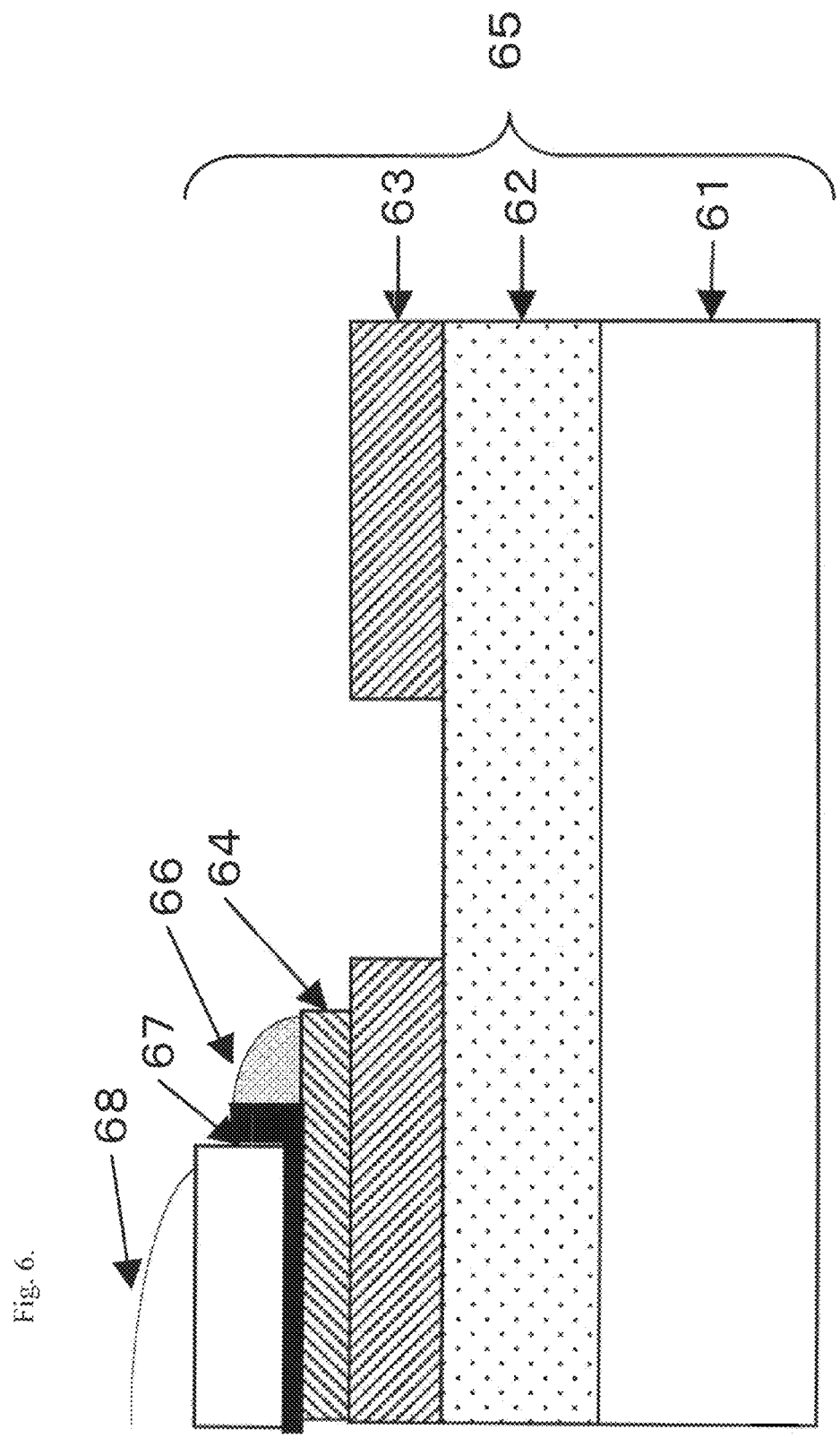
[FIG. 6] A diagram showing an example of a metal base circuit board according to Embodiment 5 of the present invention.

FIG. 6 is a schematic view showing one example of a metal base circuit board according to Embodiment 5. The metal base circuit board of Embodiment 5 comprises a metal plate (substrate) 61, an insulating layer 62, a circuit foil (A) 63 (aluminum), and a circuit foil (B) 64 (copper or nickel), and a plurality of LEDs 68 are mounted and joined by solder joint portions 66 and the like.

Embodiment 5 has the characteristic that the circuit foil (A) 63 (aluminum) has a high reflectivity, and it is preferable for this to be a reflectivity of 80% or greater in the visible light region from 420 nm to 800 nm. Further, it is preferable to have a reflectivity of 80% or greater for light having a wavelength of 460 nm (blue), 525 nm (green), and 620 nm (red).

<Embodiment 6>

Figure 7:
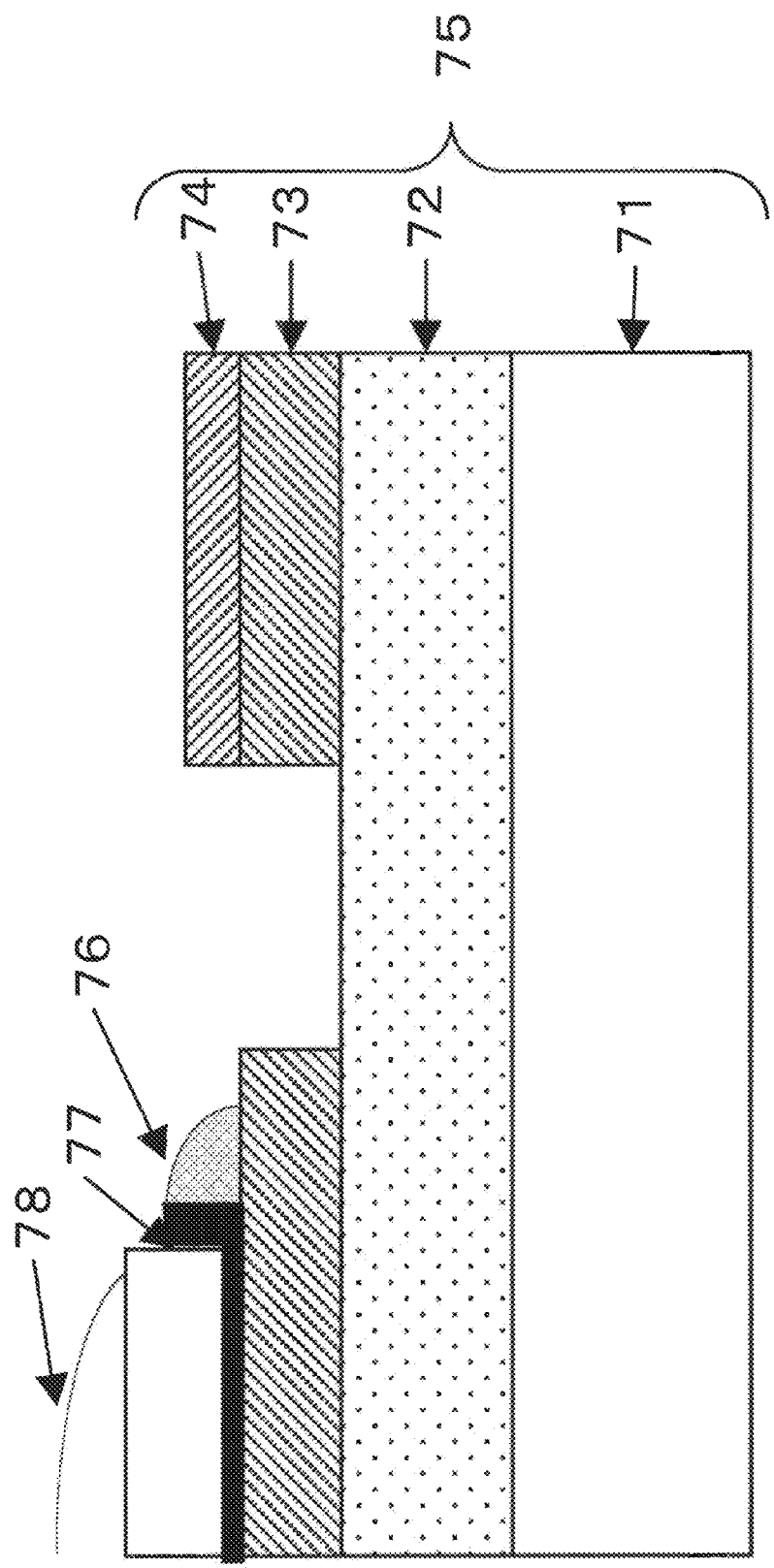
[FIG. 7] A diagram showing an example of a metal base circuit board according to Embodiment 6 of the present invention.

FIG. 7 is a schematic view showing one example of a metal base circuit board according to Embodiment 6. The metal base circuit board of Embodiment 6 shows a metal base circuit board 75 comprising a metal plate (substrate) 71, an insulating layer 72, a circuit foil (A) 73 (copper), and a circuit foil (B) 74 (aluminum or nickel), and a plurality of LEDs 78 are mounted and joined by solder joint portions 76 and the like.

Embodiment 6 has the characteristic that the circuit foil (B) 74 (aluminum or nickel) has a high reflectivity, and it is preferable for this to be a reflectivity of 80% or greater in the visible light region from 420 nm to 800 nm. Further, it is preferable to have a reflectivity of 80% or greater for light having a wavelength of 460 nm (blue), 525 nm (green), and 620 nm (red).

Herebelow, each component of the metal base circuit boards according to Embodiments 3 through 6 shall be explained in detail.

[Metal Plate (Substrate)]

In Embodiments 3 through 6, for the substrates 41, 51, 61, and 71, copper and copper alloy, aluminum and aluminum alloy, iron, and stainless steel or the like, having a good thermal conductivity, may be used. Additionally, the thickness of the substrate 41, 51, 61, and 71 is preferably 18 μm or greater and 4.0 mm or less. If the thickness of the substrate 41, 51, 61, and 71 is too thin, there is a tendency for the rigidity of the circuit board to decrease, making it inappropriate for actual use, and if the thickness is too thick, there is a tendency for it to become less preferable for miniaturization. Concretely, if the thickness of the substrate 41, 51, 61, and 71 is 18 μm or greater, sufficient rigidity can be maintained, and if it is 4.0 mm or less, then it does not become a problem for miniaturization.

[Insulating Layer]

In Embodiments 3 through 6, it is preferable for the thickness of the insulating layer 42, 52, 62, and 72 to be 50 μm or greater and 400 μm or less, and further preferable for it to be 80 μm or greater and 200 μm or less. If the insulating layer 42, 52, 62, and 72 is thin, the electrically insulating property will be reduced, and if it is too thick, a sufficient heat dissipation characteristic cannot be obtained. Concretely, if the insulating layer 42, 52, 62, and 72 is 50 μm or greater, then a sufficient electrical insulating property can be maintained, and if it is 400 μm or less, then a sufficient heat dissipation characteristic can be maintained.

For the insulating layer 42, 52, 62, and 72, thermosetting resin is normally used, and for the thermosetting resin, epoxy resin, phenol resin, silicone resin, acrylic resin, and the like may be used. Among these, it is preferable to use those that have as the principal components bifunctional epoxy resin and polyaddition type curing agents, which, while containing inorganic fillers, have an excellent bonding strength with the substrate 41, 51, 61, and 71, and the circuit foil (A) 43, 53, 63, and 73, and an excellent insulating property, in the cured state.

As the polyaddition type curing agents, it is preferable to use anhydrides or phenols that have excellent mechanical and electrical properties, and in order to secure the mechanical and electrical properties of the insulating layer 42, 52, 62, and 72, it is preferable to add these so that the active hydrogen equivalent weight is 0.8 to 1 times the epoxy equivalent weight of the epoxy resin contained in the thermosetting resin.

As said epoxy resin, it is preferable to use a relatively cheaply acquirable bifunctional epoxy resin, such as bisphenol A diglycidyl ether, bisphenol F diglycidyl ether, bisphenol S diglycidyl ether, resorcinol diglycidyl ether, hexahydro-bisphenol A diglycidyl ether, polypropylene glycol diglycidyl ether, neopentyl glycol diglycidyl ether, phthalic acid diglycidyl ester, or dimer acid diglycidyl ester.

As said polyaddition type curing agent, it is preferable to use a relatively cheaply acquirable anhydride, such as phthalic anhydride, tetrahydro methyl phthalic anhydride, hexahydro phthalic anhydride, trimellitic anhydride, methyl nadic anhydride, or a phenol, such as phenol novolac resin, orthocresol novolac resin, bisphenol A novolac resin or the like.

Additionally, in order to improve the curing reaction of said epoxy resin and polyaddition type curing agent, a curing catalyst may be added. As a curing catalyst, imidazole-based catalysts are preferable, such as 2-methyl imidazole, 2-undecyl imidazole, 2-heptadecyl imidazole, 1,2-dimethyl imidazole, 2-methyl-4-methyl imidazole, 2-phenyl imidazole, 2-phenyl-4-methyl imidazole, 1-benzyl-2-methyl imidazole, 1-benzyl-2-phenyl imidazole, 2,3-dihydro-1H-pyrolo[1,2-a]benzimidazole, 2-phenyl-4,5-dihydroxymethyl imidazole, 2,4-diamino-6-[2'-methyl imidazolyl-(1')]-ethyl-s-triazine, 2,4-diamino-6-[2'-undecyl imidazolyl-(1')]-ethyl-s-triazine, and 1-cyanomethyl-2-methyl imidazole. The amounts thereof to be added may be changed arbitrarily in order to obtain the desired curing rate.

It is preferable for the chloride ion concentration in the thermosetting resin constituting the insulating layer 42, 52, 62 and 72 to be 1000 ppm or less, and more preferable for it to be 500 ppm or less. If the chloride ion concentration in the thermosetting resin composition is 1000 ppm or less, the movement of ionic impurities under high temperatures or direct voltages and the consequent reduction of the electrical insulation property can be suppressed.

[Inorganic Filler]

It is preferable for the inorganic filler contained in the insulating layer 42, 52, 62, and 72 to be electrically insulating and have a good thermal conductivity. For example, silica, alumina, aluminum nitride, silicon nitride, and boron nitride may be used. In order to secure an appropriate fluidity, it is preferable for the amount of inorganic filler contained in the insulating layer 42, 52, 62, and 72 to be from 30% by volume to 80% by volume, and more preferable for the amount to be from 50% by volume to 75% by volume.

For the grain size of the inorganic filler, it is preferable for it to contain two types with an average grain size of from 0.6 μm to 2.4 μm, and from 5 μm to 20 μm. By mixing together coarse grains having a large average particle size, and fine grains having a small average particle size, a denser packing than when each are used alone becomes possible, and a good thermal conductivity can be obtained. Additionally, the grain shapes can be crushed, spherical, or scale-like.

If the amount contained of inorganic filler is too small, there is a tendency for it to be difficult to obtain the thermal conductivity necessary for a circuit board for a backlight using an LED package, and if it is too large, then the insulating material will become highly viscous and make the coating of the insulating material difficult, so that there will be a tendency for problems with the mechanical properties or electrical properties to arise easily.

Additionally, it is preferable for the sodium ion concentration of the inorganic filler to be 500 ppm or less, and more preferable for it to be 100 ppm or less. If the sodium ion concentration in the inorganic filler is great, then there are cases where there is a tendency for movement of ionic impurities under high temperatures or direct voltages to occur, reducing the electrical insulation property. If the sodium ion concentration in the inorganic filler becomes 500 ppm or lower, then the movement of ionic impurities under high temperatures or direct voltages, and the consequent reduction of the electrical insulation property, can be suppressed.

Additionally, the insulating layer 42, 52, 62, and 72 may contain white pigment in order to obtain a higher reflectivity. When using a white pigment for the insulating layer 42, 52, 62, and 72, zinc oxide and/or titanium dioxide may preferably be used. For the titanium dioxide, from the standpoint of stability, the rutile type is preferable.

Further, it is more preferable for the surface of the above-mentioned white pigment to be coated with aluminum hydroxide, or aluminum hydroxide and silicon dioxide. Additionally, it is preferable for from 1 weight portion to 30 weight portions of said white pigment to be contained. If the amount is too low, a reflectivity improving effect cannot be expected. If the amount is too high, there will be a large rise of the resin viscosity, and in some cases there will be a tendency for it to become easy to include defects during application, and thus reduce the electrical insulation property. If the amount of said white pigment contained is 1 weight portion or greater, then the reflectivity improves, and if it is 30 weight portions or less, then the electrical insulation property will not become reduced.

The insulating layer 42, 52, 62, and 72 may be multi-layered, and in this case, it suffices for said white pigment to be contained in the layer that corresponds to the outermost layer of the circuitized surface.

[Circuit Foil (A)]

It is preferable for the thickness of the circuit foil (A) 43, 53, 63, and 73 to be 5 μm or greater and 300 μm or less. If it is too thin, the function as a circuit cannot sufficiently be achieved, and if it becomes thicker, then application to uses with high electric current becomes possible, but if it is too thick, it is not preferable from the standpoint of cost versus effect. If the thickness of the circuit foil (A) 43, 53, 63, and 73 is 5 μm or greater, then application to uses with high electric current becomes possible, and if it is 300 μm or less, then production at low cost becomes possible. For the circuit foil (A) 53, 53, 63, and 73, it is possible to use copper, aluminum and alloys thereof.

[Circuit Foil (B)]

It is preferable for the thickness of the circuit foil (B) 44, 54, 64, and 74 to be 0.01 μm or greater and 400 μm or less. If the thickness of the circuit foil (B) 44, 54, 64, and 74 is 0.01 μm or greater, functioning as a circuit can be sufficiently secured, and if it is 400 μm or less, production is possible at low cost.

In cases such as Embodiment 3 and Embodiment 6, where copper is used as the circuit foil (A) 33, 63, then for the circuit foil (B) 34, 64, aluminum or nickel is preferably used, and it has the function of a covering layer for obtaining a high reflectivity. If the circuit foil (B) 34, 64 is too thin, there is a tendency for it to become difficult to obtain a sufficient reflectivity effect, and if it becomes too thick, it becomes unpreferable from the standpoint of cost versus effect.

Additionally, in cases such as Embodiment 4 or Embodiment 5, in which aluminum is used for the circuit foil (A) 43, 53, copper or nickel is preferably used for the circuit foil (B) 44, 54, and this has the effect of improving the solder wettability when mounting parts onto the circuit. If the circuit foil (B) 44, 54 is too thin, then there is a tendency for not being able to improve the solder wettability sufficiently, and if it is too thick, it becomes unpreferable from the standpoint of cost versus effect.

As methods for providing a circuit foil (B) 44, 54, 64, and 74 on top of a circuit foil (A) 43, 53, 63, and 73, it is possible to provide the already layered foils on the insulating layer 42, 52, 62, and 72, or it is possible to provide the circuit foil (A) 43, 53, 63, and 73 on top of the insulating layer 42, 52, 62, and 72, and then separately to provide the circuit foil (B) 44, 54, 64, and 74. There are no particular restrictions on the methods for layering these, and publicly known methods, such as layering by rolling, plating, and deposition can be done, and additionally, a plurality of layers of other metal foil layers can be provided between the circuit foil (A) 43, 53, 63, and 73, and circuit foil (B) 44, 54, 64, and 74.

[White Film]

For the white film 45 and 55, it is preferable for it to have a reflectivity of 70% or greater in the visible light region of 420 to 800 nm. Further, for light having the wavelengths of 460 nm (blue), 525 nm (green), and 620 nm (red), it is preferable to have a reflectivity of 70% or greater for each. For such a material, it is preferable to use a white solder resist.

As a white solder resist, a thermally curable white solder resist, a UV curable white solder resist, a combination UV-thermally curable white solder resist, and the like may be used.

As a white pigment contained in said white solder resist, titanium dioxide is preferable, and among this the rutile type is more preferable. Since the rutile type has excellent stability, the photocatalytic action is weak, so in comparison to other structures, the deterioration of the resin components can be suppressed.

For said titanium dioxide, it is more preferable for this to be coated with silicon dioxide or aluminum hydroxide or the like. Titanium dioxide that has been treated in this manner will have its photocatalytic activity suppressed, and so this can reduce the deterioration of the resin component. Additionally, with regard to the titanium dioxide content, from the standpoint of the durability of the white film itself, it is preferable for this to be 30 wt % or greater, and 60 wt % or less in the white film. The titanium dioxide may be used alone, or it can be used in conjunction with other white pigments such as zinc oxide or barium sulfate.

For the resin to be used in said solder resist, from the standpoint of the durability of the white film itself, an epoxy resin for the case of a thermally curable type white solder resist, an acryl resin for the case of a UV curable type white solder resist, and the combined use of an epoxy resin and an acryl resin for the case of a combination UV-thermally curable white solder resist is preferable.

<Operations and Effects>

Herebelow, the operations and effects of Embodiments 1 through 6 shall be explained.

The metal base circuit board according to Embodiment 1 is a metal base circuit board wherein a circuit 13 is provided on top of a metal plate (circuit foil) 11 through an insulating layer 12, and is a metal base circuit board characterized by at least providing a white film 14 on top of an insulating layer 12, so that it has, in addition to the conventional function of a printed circuit board of mounting electronic parts, the new function of light reflectivity.

Here, the reflectivity of said white film 14 for light having a wavelength of 460 nm, 525 nm, and 620 nm may be 80% or greater for each. In this way, this can be used preferably for liquid crystal display devices and the like for personal computers and televisions and the like.

Additionally, the minimum value of the reflectivity for light having a wavelength of 420 to 800 nm of said white film may be 70% or greater. In this way, this can be used preferably for liquid crystal display devices and the like for personal computers and televisions and the like.

Additionally, the thermal conductivity of said insulating layer 12 may be 1 W/mK. In this way, the heat generated by the LED can be dissipated and the stability of the brightness of the LEDs can be contributed to, and in addition, a long operating lifetime for the LEDs can be achieved.

Additionally, said insulating layer may contain an inorganic filler and an epoxy resin and a curing agent for said epoxy resin. In this way, a sufficient electrical insulation property for the insulating layer can be obtained.

Additionally, said inorganic filler may be such that for a total amount of 100 mass portions for the epoxy resin and said curing agent for the epoxy resin, 70 to 95 mass portions may be blended. In this way, an appropriate fluidity can be attained during the application of the insulating layer.

Additionally, said insulating layer 12 may contain a bifunctional epoxy resin. In this way, a sufficient bonding strength between the metal plate of the insulating layer and the circuit can be obtained.

Additionally, said insulating layer may contain anhydrides or phenols. In this way, sufficient mechanical and electrical properties for the insulating layer can be secured.

Additionally, anhydrides or phenols may be contained in the bifunctional epoxy resin in such amounts that the active hydrogen equivalent weight is 0.8 to 1 times the epoxy equivalent weight. In this way, the mechanical and electrical properties of the insulating layer can be further improved.

Additionally, said insulating layer 12 may contain 25 to 50% by volume of thermosetting resin, and the remainder may be an inorganic filler having two types of average grain sizes of 0.6 to 2.4 μM and 5 to 20 μm, their shapes being spherical, crushed, or scale-like. In this way, a sufficient thermal conductivity for the insulating layer can be obtained.

Additionally, said white film 14 may contain titanium dioxide for the white pigment, and said titanium dioxide may be rutile-type and the surface may be covered with aluminum hydroxide or silicon dioxide. In this way, the deterioration of the resin component of the white film may be suppressed.

The multi-layer circuit metal base circuit board according to Embodiment 2 is a metal base circuit board wherein a plurality of insulating layers 32, 33 and circuits 34, 36 are alternately provided on a metal plate 31, and it is a metal base circuit board characterized in that a white film is provided at least on the insulating layer 36 that is furthest from the metal plate 31, so in addition to the conventional function of a printed circuit board of mounting electronic circuits, it has the new function of having a light reflecting function.

Here, the insulating layer 36 that is furthest from said metal plate 31 may contain at least one type of white pigment selected from zinc oxide, calcium carbonate, titanium dioxide, alumina, and smectite. In this way, said metal base circuit board can obtain a higher reflectivity.

Additionally, said insulating layer 36 that is furthest from said metal plate 31 may contain titanium dioxide, and said titanium dioxide may be rutile type and the surface thereof may be covered with aluminum hydroxide or silicon dioxide. In this way, the deterioration of the resin component of the insulating layer can be suppressed.

Additionally, said white film 37 may contain titanium dioxide, and said titanium dioxide may be rutile type and the surface thereof may be covered with aluminum hydroxide or silicon dioxide. In this way, the deterioration of the resin component of the insulating layer can be suppressed.

The metal base circuit board according to Embodiment 3 is a metal base circuit board wherein a metal plate (substrate) 41, an insulating layer 42 formed on one or both faces of said metal plate (substrate) 41, a circuit (circuit foil (A) 43) formed out of a metal foil on top of said insulating layer 42, and a metal of a different type from the metal forming said circuit on top of said circuit are layered, the metal base circuit board being characterized in that said circuit (circuit foil (A) 43) is formed from copper foil, and a nickel layer or an aluminum layer (circuit foil (B) 44) is layered on top of one portion or the entirety of said copper foil, so that in addition to the function of a conventional printed circuit board of mounting electronic parts, it has the new function of a light reflecting function. Here, the metal base circuit board according to Embodiment 6 has a similar effect.

Additionally, the metal base circuit board according to Embodiment 4 is a metal base circuit board wherein a metal plate (substrate) 51, an insulating layer 52 formed on one or both faces of said metal plate (substrate) 51, a circuit (circuit foil (A) 53) formed out of a metal foil on top of said insulating layer 52, and a metal of a different type from the metal forming said circuit on top of said circuit are layered, the metal base circuit board being characterized in that said circuit (circuit foil (A) 53) is formed from aluminum foil, and a nickel layer or an copper layer (circuit foil (B) 54) is layered on top of one portion or the entirety of said aluminum foil, so that in addition to the function of a conventional printed circuit board of mounting electronic parts, it has the new function of a light reflecting function. Here, the metal base circuit board according to Embodiment 5 has a similar effect.

Here, said insulating layer 41, 51 may be white. In this way, said metal base circuit board may obtain a higher reflectivity.

Additionally, in said metal base circuit board, the reflectivity of the circuit portion (circuit foil (B) 44, circuit foil (A) 53) for visible light having a wavelength of 460 nm, 525 nm, and 620 nm may be 80% or greater for each. In this way, it can be used preferably for liquid crystal display devices and the like for personal computers and televisions and the like.

Additionally, said insulating layer 41, 51 may contain a white pigment, and said white pigment may be one or both of zinc oxide or rutile type titanium dioxide. In this way, said metal base circuit board may obtain a higher reflectivity.

Additionally, the surface of said white pigment may be covered with either one of "aluminum hydroxide" or "aluminum hydroxide and silicon dioxide". In this way, the deterioration of the resin component of the insulating layer can be suppressed.

Additionally, the thermal conductivity of said insulating layer 41, 51 may be 0.5 W/mK or greater, and 4.0 W/mK or less. In this way, the heat generated from the LEDs can be effectively dissipated and this will contribute to the stabilization of the brightness of the LEDs, and a long operating life for the LEDs can be achieved.

Additionally, said insulating layers 41, 51, and said circuits (circuit foil (B) 44, circuit foil (A) 53) may have white films 45, 55. In this way, said metal base circuit board can obtain a higher reflectivity.

Additionally, said white film 45, 55 can contain a rutile type titanium dioxide or zinc oxide as a white pigment. In this way, a higher reflectivity can be obtained.

Additionally, said white pigment may be covered with either one of "aluminum hydroxide" or "aluminum hydroxide and silicon dioxide". In this way, the deterioration of the resin component of the insulating layer can be suppressed.

Additionally, said metal base circuit board may be utilized as an LED module.

In this way, an expensive light reflecting sheet does not need to be used, and the number of steps during the manufacture of the backlight and the needed parts may be reduced, and this will lead to a reduction in cost.

<Different Representation Form for Embodiments 1 through 6>

Herebelow, a different representation form for Embodiments 1 through 6 of the metal base circuit board according to the present invention is described.

First, Embodiment 1 shall be described in a different representation form.

(1) A metal base circuit board wherein, in a metal base circuit board such that an insulating layer 12 is formed on top of a metal plate (metal foil) 11, and a circuit 13 is formed on top of the insulating layer 12, a white film 14 is provided on top of the insulating layer 12 and the circuit 13.

(2) The metal base circuit board of (1), where the reflectivity of the white film 14 for visible light of 460 nm, 525 nm, and 620 nm is 80% or greater for each.

(3) The metal base circuit board of (1) or (2), where the thermal conductivity of the insulating layer 12 is 1 to 4 W/mK.

(4) Any one of the metal base circuit boards of (1) through (3), wherein the insulating layer 12 contains a bifunctional epoxy resin.

(5) The metal base circuit board of (4), wherein the insulating layer 12 contains anhydrides or phenols.

(6) The metal base circuit board of (5), wherein anhydrides or phenols are contained so as to make the activated hydrogen equivalent weight be 0.8 to 1 times the epoxy equivalent weight of said bifunctional epoxy resin.

(7) Any one of the metal base circuit boards of (1) through (3), wherein the insulating layer 12 contains 25 to 50% by volume of thermosetting resin, the remainder being an inorganic filler having two types of average grain sizes, of 0.6 to 2.4 µm, and of 5 to 20 µm, the shapes thereof being spherical, crushed, or scale-like.

(8) Any of the metal base circuit boards of (1) through (7), wherein the white film 14 contains titanium dioxide as a white pigment, and the titanium dioxide is rutile type, and the surface thereof is coated with aluminum hydroxide or silicon dioxide.

Next, Embodiment 2 shall be described in a different representation form.

(9) A metal base circuit board, being a metal base circuit board where a circuit 23 is provided, through an insulating layer 22, on top of a metal plate 21, and a white film 24 is provided at least on top of the insulating layer 22.

(10) A metal base circuit board wherein a plurality of insulating layers 32, 33 and circuits 34, 36 are alternately provided on top of a metal plate 31, and a white film 37 is provided at least on top of the insulating layer 33 that is furthest from the metal plate 31.

(11) The metal base circuit board of (9) or (10), characterized in that the circuits are formed by the metal plates 21, 31.

(12) The metal base circuit board of any of (9) through (11), characterized in that the insulating layers 22, 32, 33 contain an inorganic filler, an epoxy resin, and a curing agent for the epoxy resin, and the thermal conductivity is 1 W/mK or greater.

(13) The metal base circuit board of any of (9) through (12), characterized in that 70 to 95 weight portions of the inorganic filler is blended in relative to a total amount of 100 weight portions for the epoxy resin and the curing agent for the epoxy resin.

(14) The metal base circuit board of (12) or (13) characterized in that the curing agent for the epoxy resin contains a substance having a hydroxyl group.

(15) The metal base circuit board of any of (1) through (14), characterized in that the insulating layer 22, 33 that is furthest from the metal plate 21, 31 contains a white pigment that is one or more types selected from among zinc oxide, calcium carbonate, titanium dioxide, alumina, and smectite.

(16) The metal base circuit board of (15), characterized in that the white pigment in the insulating layer 22, 33 is titanium dioxide.

(17) The metal base circuit board of (16), wherein the titanium dioxide is rutile type, and the surface is coated with aluminum hydroxide or silicon dioxide.

(18) The metal base circuit board of (17), characterized in that the white pigment in the insulating layer 22, 33 is zinc oxide.

(19) The metal base circuit board of any of (9) through (18), characterized in that the white film 24, 37 is such that the reflectivity for light having a wavelength of 420 to 800 nm has a minimum value of 70% or greater.

(20) The metal base circuit board of any of (9) through (19), characterized in that the white film 24, 37 contains titanium dioxide.

(21) The metal base circuit board of any of (9) through (20), wherein the titanium dioxide is rutile type and the surface is coated with aluminum hydroxide or silicon dioxide.

Next, Embodiments 3 through 6 shall be described in a different representation form.

(22) A circuit board, being a circuit board having a metal plate (substrate) 41 formed from metal foil, an insulating layer 42 formed on one or both sides of this metal plate (substrate) 41, and a circuit (circuit foil (A) 43) formed with metal foil on an exposed surface of this insulating layer 42, said circuit (circuit foil (A) 43) being formed from copper foil, and a nickel layer or an aluminum layer (circuit foil (B) 44) being layered upon one portion or the entirety of said copper foil.

(23) A circuit board, being a circuit board having a metal plate (substrate) 51 formed from metal foil, an insulating layer 52 formed on one or both sides of this metal plate (substrate) 51, and a circuit (circuit foil (A) 53) formed with metal foil on an exposed surface of this insulating layer 52, said circuit (circuit foil (A) 53) being formed from aluminum foil, and a nickel layer or a copper layer (circuit foil (B) 54) being layered upon one portion or the entirety of said aluminum foil.

(24) The circuit board of (22) or (23), wherein the insulating layer 42, 52 is white.

(25) The circuit board of any of (22) through (24), having a white film 45, 55 formed on top of the insulating layer 42, 52 and the circuit (circuit foil (B) 44, circuit foil (A) 53).

(26) The circuit board of any of (22) through (25), where the reflectivity of visible light of 450 nm, 555 nm, and 660 nm is 80% or greater for each.

(27) The circuit board of any of (24) through (26), wherein the white pigment of the insulating layer 42, 52 contains one or both of zinc oxide and rutile type titanium dioxide.

(28) A circuit board wherein the surface of the white pigment of (27) is coated by either "aluminum hydroxide" or "aluminum hydroxide and silicon dioxide".

(29) The circuit board of any of (22) through (28), wherein the thermal conductivity of the insulating layer 42, 52 is 0.5 W/mK or greater, and 4.0 W/mK or less.

(30) The circuit board of any of (22) through (29), wherein the thickness of the metal plate (substrate) 41, 51 is 18 μm or greater, and 4.0 mm or less.

(31) The circuit board of any of (22) through (30), wherein the metal plate (substrate) 41, 51 is a material of one type selected from among aluminum, copper, and iron.

(32) The circuit board of any of (25) through (30), wherein the white film 45, 55 contains rutile type titanium dioxide and/or zinc oxide as a white pigment.

(33) A printed circuit board wherein the white pigment of (32) is coated with "aluminum hydroxide", or "aluminum hydroxide and silicon dioxide".

(34) An LED module having the metal base circuit board of any of (22) through (33).

Various embodiments of the metal base circuit board according to the present invention have been explained, but the metal base circuit board according to the present invention is not restricted to these.

For example, "white" does not have to be pure white, and it is substantially sufficient for it to be a color that can reflect light efficiently. For example, it can be a light beige color or a light green color, or the like, and this can be appropriately adjusted according to the environment and aim of application. Additionally, the metals such as copper and aluminum may contain impurities, and it is substantially sufficient for them to have properties such as electrical conductivity. Additionally, the light source to be mounted on the metal base circuit board may be, besides an LED, a fluorescent tube or a cold cathode tube. Further, the metal base circuit board may have, in addition to the light source, various semiconductor devices such as sensors mounted thereupon.

EXAMPLES

Herebelow, working examples and comparison examples shall be given, and the present invention shall be explained in further detail. However, the present invention is not restricted to these.

For examples 1 through 3, the metal base circuit board shown in FIG. 1 was produced.

Example 1

On a copper foil having a thickness of 35 μm, an insulating layer (insulating layer 12) was formed so that the thickness after curing would be 100 μm, by adding, to bisphenol A type epoxy resin ("EP-828", manufactured by Japan Epoxy Resin Co.), phenol novolac ("TD-2131", manufactured by Dainippon Ink and Chemicals Co.) as a curing agent, and then blending in a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.), so as to be 56% by volume of the insulating layer.

Next, aluminum foil (metal plate 11) having a thickness of 200 μm was stuck to it, and the insulating layer was thermally cured by heating, thereby obtaining a metal base circuit board wherein the sodium ion concentration was 50 ppm or less in the entirety of the inorganic filler in the insulating layer.

Regarding the metal base circuit board obtained, it was made into a metal base circuit board by forming a copper circuit (circuit 13) by masking certain given locations using an etching resist, and then removing the etching resist. Further, in order to form a white film (white film 14) having a high reflectivity on top of the metal base circuit board, various white solder resist layers were applied, and then cured using heat and UV light. At this time, a white film is not formed on the LED package mounting portion on the copper circuit.

For substrate A, "SSR-6300S", manufactured by San-ei Kagaku Co., was used as a white solder resist.

Example 2

For substrate B, "PSR-4000LEW1", manufactured by Taiyo Ink Mfg. Co., was used as a white solder resist.

Example 3

For substrate C, "DSR-330S42-13W", manufactured by Tamura Kaken Corp., was used as a white solder resist.

As a result, the reflectivity of Substrate A, Substrate B, and Substrate C, was respectively 83%, 85%, and 84% at 460 nm (blue), 87%, 90%, and 88% at 525 nm (green), and 87%, 89%, and 87% at 620 nm (red). These results are shown in Table 1.

TABLE 1

| Measured Wavelength | Reflectivity (%) | | | |
|---|---|---|---|---|
| | Ex. 1 | Ex. 2 | Ex. 3 | Comp. 1 |
| 460 | 83 | 85 | 84 | 74 |
| 525 | 87 | 90 | 88 | 77 |
| 620 | 87 | 89 | 87 | 76 |

Comparison Example 1

As an example for comparison, an FR-4 substrate was prepared, and the results of measurement in the same way as Examples 1 through 3 were 74%, 77%, and 76%, going from shorter wavelengths to longer wavelengths. These results are shown in Table 1.

As can be seen in Table 1, the metal base circuit board according to the present invention has a high reflectivity in the visible light range.

Next, Embodiments 4 through 9 shall be explained. In Embodiments 4 through 8, a single layer circuit metal base circuit board as shown in FIG. 2 was produced. Additionally, in Embodiment 9, the multi-layer circuit metal base circuit board shown in FIG. 3 was produced.

(Embodiment 4)

On a copper foil having a thickness of 35 μm, a coating layer (insulating layer 22) was formed so that the thickness after curing would be 150 μm, by adding, to 100 weight portions of bisphenol A type epoxy resin ("EP-828", manufactured by Japan Epoxy Resin Co.), 50 weight portions of phenol novolac ("TD-2131", manufactured by Dainippon Ink and Chemicals Co.) as a curing agent, and then blending in a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.), so as to be 56% by volume (for spherical coarse grains and spherical fine grains, a weight ratio of 7:3) of the insulating layer.

Next, aluminum foil (metal plate 21) having a thickness of 200 μm was stuck to it, and the coating layer was thermally cured by heating, thereby obtaining a metal base circuit board wherein the sodium ion concentration was 50 ppm or less in the entirety of the inorganic filler in the insulating layer.

Regarding the metal base circuit board obtained, it was made into a metal base circuit board by forming a copper circuit (circuit 23) by masking certain given locations using an etching resist, and then removing the etching resist.

In order to form a white film (white film 24) having a high reflectivity on top of said metal base circuit board, a white solder resist layer was applied, and then cured using heat and light. At this time, a white film was not formed on the LED package mounting portion on the copper circuit. "SSR-6300S", manufactured by San-ei Kagaku Co., was used as a white solder resist.

In addition to carrying out measurements of the reflectivity for the obtained metal base circuit boards, blue, red, and green LEDs of output power 3W-class were mounted, and luminance was measured using a luminance colorimeter ("BM-7", manufactured by Topcon Technohouse Corp.). The results are shown in Table 2.

(Embodiment 5)

The same measurements as for Embodiment 4 were carried out for a metal base circuit board that was obtained in the same manner as in Embodiment 4, with the exception of having used "PSR-4000LEW1", manufactured by Taiyo Ink Mfg. Co., as a white solder resist.

(Embodiment 6)

The same procedure as in Embodiment 4 was carried out, with the exception of having used "DSR-330S42-13W", manufactured by Tamura Kaken Corp., as a white solder resist. The results are shown in Table 2.

(Embodiment 7)

On a copper foil having a thickness of 35 μM, 50 weight portions of phenol novolac ("TD-2131", manufactured by Dainippon Ink and Chemicals Co.) were added as a curing agent to 100 weight portions of bisphenol A type epoxy resin ("EP-828", manufactured by Japan Epoxy Resin Co.), and then a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.) was blended in, so as to be 56% by volume (for spherical coarse grains and spherical fine grains, a weight ratio of 7:3) of the insulating layer, and titanium dioxide ("PFC104", manufactured by Ishihara Sangyo Kaisha Ltd.) was further blended in as a white pigment so as to be 10% by volume of the insulating layer. Further, a coating layer was formed so that the thickness after curing would be 150 μm, and next, aluminum foil having a thickness of 200 μm was stuck to it, and the coating layer was thermally cured by heating, thereby obtaining a metal base circuit board wherein the sodium ion concentration was 50 ppm or less in the entirety of the inorganic filler in the insulating layer.

Further, regarding said metal base circuit board, it was made into a metal base circuit board by forming a copper circuit by masking certain given locations using an etching resist, and then removing the etching resist.

Further, in order to form a white film having a high reflectivity on top of said metal base circuit board, a white solder resist layer was applied, and then cured using heat and light. At this time, a white film was not formed on the LED package mounting portion on the copper circuit. "PSR-4000LEW1", manufactured by Taiyo Ink Mfg. Co., was used as a white solder resist. The same measurements as for Embodiment 4 were carried out for the metal base circuit board that was obtained. The results are shown in Table 2.

(Embodiment 8)

On a copper foil having a thickness of 35 μM, 50 weight portions of phenol novolac ("TD-2131", manufactured by Dainippon Ink and Chemicals Co.) were added as a curing agent to 100 weight portions of bisphenol A type epoxy resin ("EP-828", manufactured by Japan Epoxy Resin Co.), and then a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.) was blended in, so as to be 56% by volume (for spherical coarse grains and spherical fine grains, a weight ratio of 7:3) of the insulating layer, and zinc oxide ("NANOFINE-50A", manufactured by Sakai Chemical Industry Co.) was further blended in as a white pigment so as to be 10% by volume of the insulating layer. Further, a coating layer was formed so that the thickness after curing would be 150 μm, and next, aluminum foil having a thickness of 200 μm was stuck to it, and the coating layer was thermally cured by heating, thereby obtaining a metal base circuit board wherein the sodium ion concentration was 50 ppm or less in the entirety of the inorganic filler in the insulating layer.

Further, regarding said metal base circuit board, it was made into a metal base circuit board by forming a copper circuit by masking certain given locations using an etching resist, and then removing the etching resist.

Further, in order to form a white film having a high reflectivity on top of said metal base circuit board, a white solder resist layer was applied, and then cured using heat and light. At this time, a white film was not formed on the LED package mounting portion on the copper circuit. "PSR-4000LEW1", manufactured by Taiyo Ink Mfg. Co., was used as a white solder resist. The same measurements as for Embodiment 4 were carried out for the metal base circuit board that was obtained. The results are shown in Table 2.

(Embodiment 9)

On a copper foil having a thickness of 35 μM, a coating layer (insulating layer (first layer) 32 in FIG. 3) was formed so that the thickness after curing would be 150 μm, by adding 50 weight portions of phenol novolac ("TD-2131", manufactured by Dainippon Ink and Chemicals Co.) as a curing agent to 100 weight portions of bisphenol A type epoxy resin ("EP-828", manufactured by Japan Epoxy Resin Co.), and then blending in a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.), so as to be 56% by volume (for spherical coarse grains and spherical fine grains, a weight ratio of 7:3) of the insulating layer. Next, a copper foil having a thickness of 35 μm was stuck on top of said coating layer.

Next, on said copper foil, a coating layer (insulating layer (second layer) 33 in FIG. 3) was formed, having the same composition as said coating layer, but further blending in titanium dioxide ("PFC104", manufactured by Ishihara Sangyo Kaisha Ltd.) as a white pigment so as to be 10% by volume of the insulating layer, so that the thickness after curing would be 150 μm. Whereby, a structure wherein copper foil and coating layers are layered alternately was obtained.

Next, aluminum foil (metal plate 31) having a thickness of 200 μm was stuck to it, and the coating layer was thermally cured by heating, thereby obtaining a metal base circuit board wherein the sodium ion concentration was 50 ppm or less in the entirety of the inorganic filler in the insulating layer.

Further, regarding said metal base circuit board, it was made into a metal base circuit board by forming a copper circuit (circuit 36) by masking certain given locations using an etching resist, etching the copper foil, and then removing the etching resist.

Further, in order to form a white film (white film 37) having a high reflectivity on top of said metal base circuit board, a white solder resist layer was applied, and then cured using heat and light. At this time, a white film is not formed on the LED package mounting portion on the copper circuit. "PSR-4000LEW1", manufactured by Taiyo Ink Mfg. Co., was used as a white solder resist. The same measurements as for Embodiment 4 were carried out for the metal base circuit board that was obtained. The results are shown in Table 2.

Comparison Example 2

On a copper foil having a thickness of 35 μm, 50 weight portions of phenol novolac ("TD-2131", manufactured by Dainippon Ink and Chemicals Co.) were added as a curing agent to 100 weight portions of bisphenol A type epoxy resin ("EP-828", manufactured by Japan Epoxy Resin Co.), and then blending in a mixture of silicon oxide having crushed coarse grains having an average grain size of 1.2 μm ("A-1", manufactured by Tatsumori Ltd.) and silicon oxide having crushed coarse grains having an average grain size of 10 μm ("5X", manufactured by Tatsumori Ltd.), so as to be 56% by volume (for spherical coarse grains and spherical fine grains, a weight ratio of 7:3) of the insulating layer, and a coating layer was formed so that the thickness after curing would be 150 μm, and next, aluminum foil having a thickness of 200 μM was stuck to it, and the coating layer was thermally cured by heating, thereby obtaining a metal base circuit board wherein the sodium ion concentration was 50 ppm or less in the entirety of the inorganic filler in the insulating layer.

Further, regarding said metal base circuit board, it was made into a metal base circuit board by forming a copper circuit by masking certain given locations using an etching resist, and etching the copper foil, and then removing the etching resist.

In addition to carrying out measurements of the reflectivity for the obtained metal base circuit boards, blue, red, and green LEDs of output power 3W-class were mounted, and luminance was measured using a luminance colorimeter ("BM-7", manufactured by Topcon Technohouse Corp.). The results are shown in Table 2.

TABLE 2

| | Max. or Min. Value in Wavelength Range | Ex. 4 | Ex. 5 | Ex. 6 | Ex. 7 | Ex. 8 | Ex. 9 | Comp. 2 |
|---|---|---|---|---|---|---|---|---|
| Reflectivity (%) | Max. Value, 450 to 470 nm | 88 | 89 | 87 | 92 | 90 | 92 | 36 |
| | Max. Value, 520 to 570 nm | 90 | 93 | 91 | 94 | 93 | 94 | 39 |
| | Max. Value, 620 to 660 nm | 90 | 92 | 89 | 93 | 93 | 93 | 43 |
| | Min. Value, 420 to 800 nm | 83 | 84 | 82 | 90 | 88 | 90 | 31 |
| Luminance (cd/m$^2$) | | 11000 | 11500 | 11300 | 12500 | 12200 | 12500 | 9200 |

As can be seen in Table 2, the metal base circuit according to the present invention has a high reflectivity in the visible light range, and a high luminance.

Next, Embodiments 10 through 13 shall be explained. In Embodiment 10, the metal base circuit board shown in FIG. 4 was produced.

(Embodiment 10)

First, a raw material inorganic filler was made by mixing together 55 portions by weight of crystalline silicon dioxide ("A-1", manufactured by Tatsumori Ltd., the maximum grain size being 96 µm (100 µm or less), containing 60 wt % (50 wt % or greater) of 5 µM to 50 µm grains, the average grain size being 12 µm) as a coarse powder of the inorganic filler, and 14 portions by weight of crystalline silicon dioxide ("5X", manufactured by Tatsumori Ltd., 70 wt % being 0.7 µm or smaller, 70 wt % being 2.0 µm or greater, the average grain size being 1.2 µm) as a fine powder of the inorganic filler.

5 portions by weight of titanium dioxide ("CP-50", manufactured by Ishihara Sangyo Kaisha Ltd., average grain size 300 nm), the surface thereof having been treated with aluminum hydroxide and silicon dioxide, was added as a white inorganic pigment.

Resin compound (a) for the circuit board was produced by adding 20 portions by mass of bisphenol A type liquid epoxy resin ("EP828", manufactured by Japan Epoxy Resin Co.) and 1 portion by mass of a silane coupling agent ("A-187", manufactured by Nippon Unicar K. K.), and mixing in said raw material inorganic filler, said inorganic pigment, and said added agents, while kneading with a kneading machine at a heated temperature of 90 degrees Celsius.

For 20 mass portions of the bisphenol A type epoxy resin, 6 mass portions of a phenol based curing resin (TD-2131, manufactured by Dainippon Ink and Chemicals Co.) was added as a curing agent, and resin composition (b) was thereby obtained.

A substrate for a hybrid integrated circuit was produced by coating said resin composition (b) onto an aluminum plate (metal plate 41) having a thickness of 1.5 mm, so that the thickness after curing is 100 µm, and after putting this into a half-cured state by heating for 0.1 hours at 100 degrees Celsius, a foil cladded with copper (circuit foil (A) 43) having a thickness of 9 µm, and aluminum (circuit foil (B) 44) having a thickness of 40 µm was layered onto the resin composition (insulating layer 42) (b), and completing the curing by further heating for 2 hours at 180 degrees Celsius.

A combined acryl and epoxy resin of heat- and UV-curing type (SSR-6300S, manufactured by San-ei Kagaku Co.) was applied onto said hybrid integrated circuit as a white solder resist, and a metal base circuit board whereupon a white film (white film 45) is formed was obtained. The composition of the abovementioned metal foil and the blending amounts are shown in Table 3.

(Embodiment 11)

In Embodiment 11, the metal base circuit board shown in FIG. 5 was produced. As shown in Table 3, a metal base circuit board was obtained in the same manner as in Embodiment 10, with the exception of a change in the composition of the circuit foil.

(Embodiment 12)

In Embodiment 12, the metal base circuit board shown in FIG. 7 was produced. As shown in Table 3, a metal base circuit board was obtained in the same manner as in Embodiment 10, with the exception that the white solder resist was not applied.

(Embodiment 13)

As shown in Table 3, a metal base circuit board was obtained in the same manner as in Embodiment 10, with the exception that the added amount of the white pigment was changed.

Comparison Example 3

A metal base circuit board was obtained in the same manner as in Embodiment 10, with the exception that the circuit foil is solely copper.

Comparison Example 4

A metal base circuit board was obtained in the same manner as in Embodiment 10, with the exception that the circuit foil is copper with silver electrolytic plating.

TABLE 3

| | | | Embodiment | | | | Comparison Ex. | |
|---|---|---|---|---|---|---|---|---|
| | Material | | 10 | 11 | 12 | 13 | 3 | 4 |
| Epoxy Resin | Bisphenol A Type Epoxy Resin | | 20 | 20 | 20 | 20 | 20 | 20 |
| Curing Agent | Phenol Based Curing Agent | | 6 | 6 | 6 | 6 | 6 | 6 |
| Inorganic Filler | Crystalline Silica | Coarse | 55 | 55 | 55 | 55 | 55 | 55 |
| | | Fine | 14 | 14 | 14 | 14 | 14 | 14 |

TABLE 3-continued

|  | Material |  | Embodiment 10 | Embodiment 11 | Embodiment 12 | Embodiment 13 | Comparison Ex. 3 | Comparison Ex. 4 |
|---|---|---|---|---|---|---|---|---|
| Foil Composition | Insulating Layer Side LED Side | Lower Upper | Cu Al | Al Cu | Cu Al | Cu Al | Cu Cu | Cu Ag |
| Coupling Agent | Silane Based Coupling Agent |  | 1 | 1 | 1 | 1 | 1 | 1 |
| White Pigment | Titanium Dioxide |  | 5 | 5 | 5 | 5 | 5 | 5 |
| White Mask | SSR6300-S |  | Yes | Yes | No | Yes | Yes | Yes |

Regarding the obtained circuit board, the following characteristics were examined. The results are shown in Table 4.

[Withstand Voltage]

For the measurement specimen, the perimeter of the copper foil and aluminum foil were etched, leaving a 20 mm diameter circular portion as a specimen. Then, the withstand voltage was measured for (1) the initial state, (2) after exposure to the conditions of temperature 121 degrees Celsius, humidity 100% RH, and 2 atm for 96 hours (labeled "Withstand Voltage: PCT96 hr" in Table 4), and (3) after exposure to the conditions of temperature 85 degrees Celsius, humidity 85% RH, and DC1000V for 1000 hours (labeled "Withstand Voltage: 85 deg C./85% *DC1000V*1000 hr" in Table 4), by immersing the test piece in insulating oil, and applying an AC voltage between the copper foil and the aluminum plate at room temperature, based upon JIS C 2110. For the measurement device, a TOS-8700, manufactured by Kikusui Electronics Corp., was used.

[Insulation Resistance]

For a measurement specimen, the perimeter of the copper foil and the aluminum foil were etched, and a comb shape and electrodes were left, based upon JIS C6481, to make a specimen. Then, the insulation resistance was measured for (1) the initial state, (2) after exposure to the conditions of temperature 121 degrees Celsius, humidity 100% RH, and 2 atm for 96 hours (labeled "Insulation Resistance: PCT96 hr" in Table 4), and (3) after exposure to the conditions of temperature 85 degrees Celsius, humidity 85% RH, and DC1000V for 1000 hours (labeled "Insulation Resistance: 85 deg C./85%*DC1000V*1000 hr" in Table 4), by applying a DC voltage of 100 volts between the copper foil and the aluminum plate at room temperature, based upon PS C 6481. For the measurement device, an R8340A, manufactured by Advantest Corp., was used.

[Reflectivity]

As measurement specimens, the circuit boards produced in said Embodiments 10 through 13, and the Comparison Examples 3 and 4 were used. As measuring points, two points, (1) between the circuits and (2) on the circuit foil (and mask) were measured.

TABLE 4

| Measurement |  |  | Ex. 10 | Ex. 11 | Ex. 12 | Ex. 13 | Comp. 3 | Comp. 4 |
|---|---|---|---|---|---|---|---|---|
| Withstand Voltage (Units: kV) | Initial |  | 8.0 | 8.0 | 8.0 | 8.0 | 8.0 | 8.0 |
|  | PCT96 hr |  | 7.5 | 8.5 | 7.2 | 7.4 | 6.5 | 3.2 |
|  | 85 deg C./85% * DC1000 V * 1000 hr |  | 6.5 | 7.8 | 6.0 | 6.2 | 6.0 | 1.6 |
| Insulation Resistance (Units: Ω/cm) | Initial |  | $1.3 \times 10^{12}$ | $2.1 \times 10^{12}$ | $1.6 \times 10^{12}$ | $1.3 \times 10^{12}$ | $1.2 \times 10^{12}$ | $1.1 \times 10^{12}$ |
|  | PCT96 hr |  | $2.8 \times 10^{11}$ | $8.9 \times 10^{11}$ | $1.2 \times 10^{11}$ | $1.2 \times 10^{11}$ | $5.8 \times 10^{10}$ | $6.5 \times 10^{8}$ |
|  | 85 deg C./85% * DC1000 V * 1000 hr |  | $3.8 \times 10^{10}$ | $1.6 \times 10^{11}$ | $2.8 \times 10^{10}$ | $2.8 \times 10^{10}$ | $4.3 \times 10^{9}$ | $5.2 \times 10^{7}$ |
| Reflectivity | Between Circuits (Units: %) | 460 nm | 72.0 | 72.0 | 56.0 | 78.0 | 72.0 | 72.0 |
|  |  | 525 nm | 78.0 | 78.0 | 60.0 | 82.0 | 78.0 | 78.0 |
|  |  | 620 nm | 76.0 | 76.0 | 64.0 | 80.0 | 76.0 | 76.0 |
|  | Circuit Foil (and Mask) (Units: %) | 460 nm | 88.0 | 90.0 | 88.0 | 88.0 | 78.0 | 89.0 |
|  |  | 525 nm | 89.0 | 92.0 | 89.0 | 89.0 | 82.0 | 90.0 |
|  |  | 620 nm | 84.0 | 89.0 | 84.0 | 84.0 | 74.0 | 86.0 |

As can be seen from Table 4, the metal base circuit board according to the present invention has a high reflectivity in the visible light range, and has a high withstand voltage and insulation resistance.

INDUSTRIAL APPLICABILITY

The metal base circuit board of the present invention is such that a white film having a high reflectivity is formed on a metal base circuit board surface whereupon an LED package is mounted, so that while it has a similar structure to a normal printed circuit board, it further has a light reflecting function. Whereby, reflected light from the light source can be efficiently provided to the liquid crystal portion even without the use of an expensive light reflecting sheet. Additionally, the number of steps required for manufacturing a liquid crystal backlight can be reduced, so this is efficient, so it is industrially applicable to the extreme as a metal base circuit board for LEDs.

The invention claimed is:

1. A metal base circuit board comprising:
  a plurality of insulating layers and circuits that are alternately provided on top of a metal plate, and
  a white film that is provided at least on top of the insulating layer that is furthest from the metal plate,
  wherein the reflectivity of said white film for light having three wavelength ranges of 450 to 470 nm, 520 to 570 nm, and 620 to 660 nm is 80% or greater, and wherein at least one of said insulating layers contains 25 to 50% by volume of a thermosetting resin, the remainder being two types of inorganic filler having average grain sizes in a range of 0.6 to 2.4 μm and in a range of 5 to 20 μm, and the shapes thereof being spherical, crushed, or scale-like.

2. The metal base circuit board according to claim 1, wherein a minimum value of the reflectivity of said white film for light having a wavelength range of 420 to 800 nm is 70% or greater.

3. The metal base circuit board according to claim 1, wherein a thermal conductivity of each of the plurality of insulating layers is 0.5 W/mK or greater, and 4.0 W/mK or less.

4. The metal base circuit board according to claim 1, wherein at least one of said insulating layers contains an inorganic filler, a resin, and a curing agent.

5. The metal base circuit board according to claim 4, comprising 70 to 95 mass percent of said inorganic filler, based on a total amount of 100 mass percent for the inorganic filler, the resin, and the curing agent.

6. The metal base circuit board according to claim 4, wherein said resin contains a bifunctional epoxy resin.

7. The metal base circuit board according to claim 6, wherein at least one of said insulating layers contains one or more anhydrides or one or more phenols.

8. The metal base circuit board according to claim 7, wherein said anhydrides or phenols are present in an amount so as to make an activated hydrogen equivalent weight be 0.8 to 1 times an epoxy equivalent weight of said bifunctional epoxy resin.

9. The metal base circuit board according to claim 1, wherein said white film contains titanium dioxide as a white pigment, and said titanium dioxide is rutile type and the surface of said pigment is coated with aluminum hydroxide or silicon dioxide.

10. The metal base circuit board according to claim 1, characterized in that said insulating layer that is furthest from the metal plate contains at least one white pigment selected from the group consisting of zinc oxide, calcium carbonate, titanium dioxide, alumina, and smectite.

11. The metal base circuit board according to claim 1, wherein said insulating layer that is furthest from the metal plate contains titanium dioxide, and said titanium dioxide is rutile type and the surface of the titanium dioxide is coated with aluminum hydroxide or silicon dioxide.

12. The metal base circuit board according to claim 1, wherein said white film contains titanium dioxide, and said titanium dioxide is rutile type and the surface of the titanium dioxide is coated with aluminum hydroxide or silicon dioxide.

13. A metal base circuit board comprising:
an insulating layer formed on one or both sides of a metal plate,
a circuit formed from a metal foil and on top of said insulating layer, and
a metal layer on top of a portion or the entirety of said circuit, said metal layer formed from a metal of a different type than the metal of the metal foil,
wherein the reflectivity of the circuit for light having wavelengths of 460 nm, 525 nm, and 620 nm is 80% or greater for each wavelength,
wherein said metal foil is a copper foil and said metal layer is a nickel layer or an aluminum layer, or said metal foil is an aluminum foil and said metal layer is a nickel layer or a copper layer.

14. The metal base circuit board according to claim 13, wherein said metal foil is an aluminum foil and said metal layer is a nickel layer or a copper layer.

15. The metal base circuit board according to claim 13, wherein said insulating layer is white.

16. The metal base circuit board according to claim 15, wherein said insulating layer contains a white pigment, and said white pigment is either one or both of zinc oxide and a rutile type titanium dioxide.

17. The metal base circuit board according to claim 16, wherein the surface of said white pigment is coated by either aluminum hydroxide or a mixture of aluminum hydroxide and silicon dioxide.

18. The metal base circuit board according to claim 13, wherein the thermal conductivity of said insulating layer is 0.5 W/mK or greater and 4.0 W/mK or less.

19. The metal base circuit board according to claim 13, wherein a white film is on top of said insulating layer and said circuit.

20. The metal base circuit board according to claim 19, wherein said white film contains a rutile type titanium dioxide or zinc oxide, as a white pigment.

21. The metal base circuit board according to claim 20, wherein said white pigment is coated by either aluminum hydroxide or a mixture of aluminum hydroxide and silicon dioxide.

22. An LED module comprising a metal base circuit according to claim 13.

23. The metal base circuit board according to claim 13, wherein said metal foil is a copper foil and said metal layer is a nickel layer or an aluminum layer.

* * * * *